(12) United States Patent
Wu et al.

(10) Patent No.: US 12,100,322 B2
(45) Date of Patent: Sep. 24, 2024

(54) STRETCHABLE DISPLAY PANEL AND CONTROL METHOD, AND DISPLAY DEVICE

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Congjie Wu, Shanghai (CN); Xingchen Qian, Shanghai (CN)

(73) Assignees: Wuhan Tianma Micro-Electronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 188 days.

(21) Appl. No.: 17/399,446

(22) Filed: Aug. 11, 2021

(65) Prior Publication Data

US 2023/0017441 A1 Jan. 19, 2023

(30) Foreign Application Priority Data

Jun. 30, 2021 (CN) .......................... 202110732621.9

(51) Int. Cl.
| | |
|---|---|
| *H01L 27/15* | (2006.01) |
| *G09F 9/30* | (2006.01) |
| *G09G 3/32* | (2016.01) |
| *H01L 25/075* | (2006.01) |
| *H01L 33/54* | (2010.01) |

(52) U.S. Cl.
CPC .............. *G09F 9/301* (2013.01); *G09G 3/32* (2013.01); *H01L 25/0753* (2013.01); *H01L 27/156* (2013.01); *H01L 33/54* (2013.01)

(58) Field of Classification Search
None
See application file for complete search history.

(56) References Cited

U.S. PATENT DOCUMENTS

| | | | | |
|---|---|---|---|---|
| 2005/0116235 | A1* | 6/2005 | Schultz | .................. H01L 24/48 |
| | | | | 257/79 |
| 2016/0198567 | A1* | 7/2016 | Hong | .................... G06F 3/0412 |
| | | | | 362/418 |
| 2018/0144958 | A1* | 5/2018 | Peterson | ............... B32B 37/025 |

(Continued)

FOREIGN PATENT DOCUMENTS

| | | |
|---|---|---|
| CN | 109728066 A | 5/2019 |
| CN | 110289292 A | 9/2019 |

*Primary Examiner* — Robert K Carpenter

(74) *Attorney, Agent, or Firm* — Anova Law Group, PLLC

(57) ABSTRACT

A stretchable display panel, a control method of the stretchable display panel, and a display device are provided. The stretchable display panel includes a stretchable substrate and a plurality of display units. The stretchable substrate contains a plurality of hollows, and a display unit is disposed corresponding to a hollow. The plurality of display units include a first display unit and a second display unit. In a stretched state, both the first display unit and the second display unit are disposed on a side of the stretchable substrate facing a light-exiting surface. In a first contracted state or a second contracted state, one of the first display unit and the second display unit is disposed on the side of the stretchable substrate facing the light-exiting surface, and the other one is disposed on a side of the stretchable substrate away from the light-exiting surface.

18 Claims, 14 Drawing Sheets

(56) References Cited

U.S. PATENT DOCUMENTS

| | | | | |
|---|---|---|---|---|
| 2019/0252358 A1* | 8/2019 | Yoo | .................... | H01L 21/67144 |
| 2020/0203312 A1* | 6/2020 | Yun | ..................... | H01L 25/0655 |
| 2020/0321392 A1* | 10/2020 | Ting | ........................ | H01L 24/97 |
| 2021/0013434 A1* | 1/2021 | Cao | ........................ | H10K 59/12 |
| 2021/0216116 A1* | 7/2021 | Liu | ........................ | G09F 9/301 |

\* cited by examiner

STRETCHABLE DISPLAY PANEL AND CONTROL METHOD, AND DISPLAY DEVICE

CROSS-REFERENCE TO RELATED APPLICATION

This application claims the priority of Chinese patent application No. 202110732621.9, filed on Jun. 30, 2021, the entirety of which is incorporated herein by reference.

FIELD

The present disclosure generally relates to the field of display technology and, more particularly, relates to a stretchable display panel and a control method, and a display device.

BACKGROUND

With the continuous development of electronic display technology, users have higher and higher requirements on display devices of electronic equipment. In recent years, flexible electronic devices and stretchable electronic devices have been developed. A flexible electronic device is a device that is capable of being bent or folded, and is often fabricated by mounting an electronic device on a flexible base substrate. A stretchable electronic device is a device whose length is capable of increasing in one or more dimensions. Stretchable electronic devices play a great role in various applications including display devices and sensor arrays. Therefore, as one of the important development directions of display devices of electronic equipment, stretchable displays have gradually received more and more attention.

The stretchable display is capable of being stretched according to an original planar shape on the premise of maintaining image quality, which makes the stretchable display not only suitable for an eye-catching mobile phone, but also satisfy the practical functions of a wearable display device such as a smart watch, a fitness tracker, etc. At present, the service life of the stretchable display device is often short, how to effectively improve the service life of the stretchable display device has become an urgent technical problem that needs to be solved.

SUMMARY

One aspect of the present disclosure provides a stretchable display panel. The stretchable display panel includes a stretchable substrate and a plurality of display units. The stretchable substrate contains a plurality of hollows, and along a thickness direction of the stretchable substrate, a hollow of the plurality of hollows penetrates through the stretchable substrate. A display unit of the plurality of display units is disposed corresponding to the hollow, and the plurality of display units include one or more first display units and one or more second display units. The stretchable display panel includes a stretched state, a first contracted state, and a second contracted state. In the stretched state, both the one or more first display units and the one or more second display units are disposed on a side of the stretchable substrate facing a light-exiting surface of the stretchable display panel. In the first contracted state, the one or more first display units are disposed on the side of the stretchable substrate facing the light-exiting surface, and the one or more second display units are disposed on a side of the stretchable substrate away from the light-exiting surface. In the second contracted state, the one or more second display units are disposed on the side of the stretchable substrate facing the light-exiting surface, and the one or more first display units are disposed on the side of the stretchable substrate away from the light-exiting surface.

Another aspect of the present disclosure provides a control method of a stretchable display panel. The control method includes providing a stretchable display panel. The stretchable display panel includes a stretchable substrate and a plurality of display units. The stretchable substrate contains a plurality of hollows, and along a thickness direction of the stretchable substrate, a hollow of the plurality of hollows penetrates through the stretchable substrate. A display unit of the plurality of display units is disposed corresponding to the hollow, and the plurality of display units include one or more first display units and one or more second display units. The control method also includes in a stretched state, controlling both the one or more first display units and the one or more second display units to be disposed on a side of the stretchable substrate facing a light-exiting surface of the stretchable display panel. In addition, the control method includes in a first contracted state, controlling the one or more first display units to be disposed on the side of the stretchable substrate facing the light-exiting surface, and controlling the one or more second display units to be disposed on a side of the stretchable substrate away from the light-exiting surface. Further, the control method includes in a second contracted state, controlling the one or more second display units to be disposed on the side of the stretchable substrate facing the light-exiting surface, and controlling the one or more first display units to be disposed on the side of the stretchable substrate away from the light-exiting surface.

Another aspect of the present disclosure provides a display device. The display device includes a stretchable display panel, and the stretchable display panel includes a stretchable substrate and a plurality of display units. The stretchable substrate contains a plurality of hollows, and along a thickness direction of the stretchable substrate, a hollow of the plurality of hollows penetrates through the stretchable substrate. A display unit of the plurality of display units is disposed corresponding to the hollow, and the plurality of display units include one or more first display units and one or more second display units. The stretchable display panel includes a stretched state, a first contracted state, and a second contracted state. In the stretched state, both the one or more first display units and the one or more second display units are disposed on a side of the stretchable substrate facing a light-exiting surface of the stretchable display panel. In the first contracted state, the one or more first display units are disposed on the side of the stretchable substrate facing the light-exiting surface, and the one or more second display units are disposed on a side of the stretchable substrate away from the light-exiting surface. In the second contracted state, the one or more second display units are disposed on the side of the stretchable substrate facing the light-exiting surface, and the one or more first display units are disposed on the side of the stretchable substrate away from the light-exiting surface.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
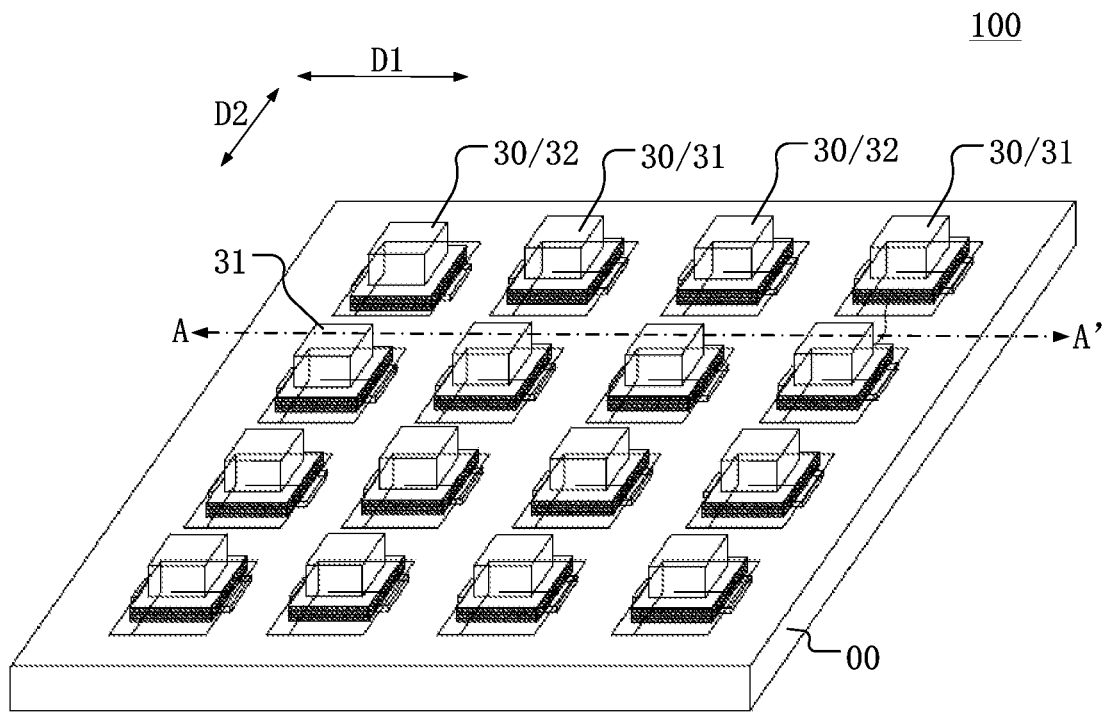
FIG. 1 illustrates a schematic diagram of an exemplary stretchable display panel in a stretched state consistent with disclosed embodiments of the present disclosure.
Figure 2:
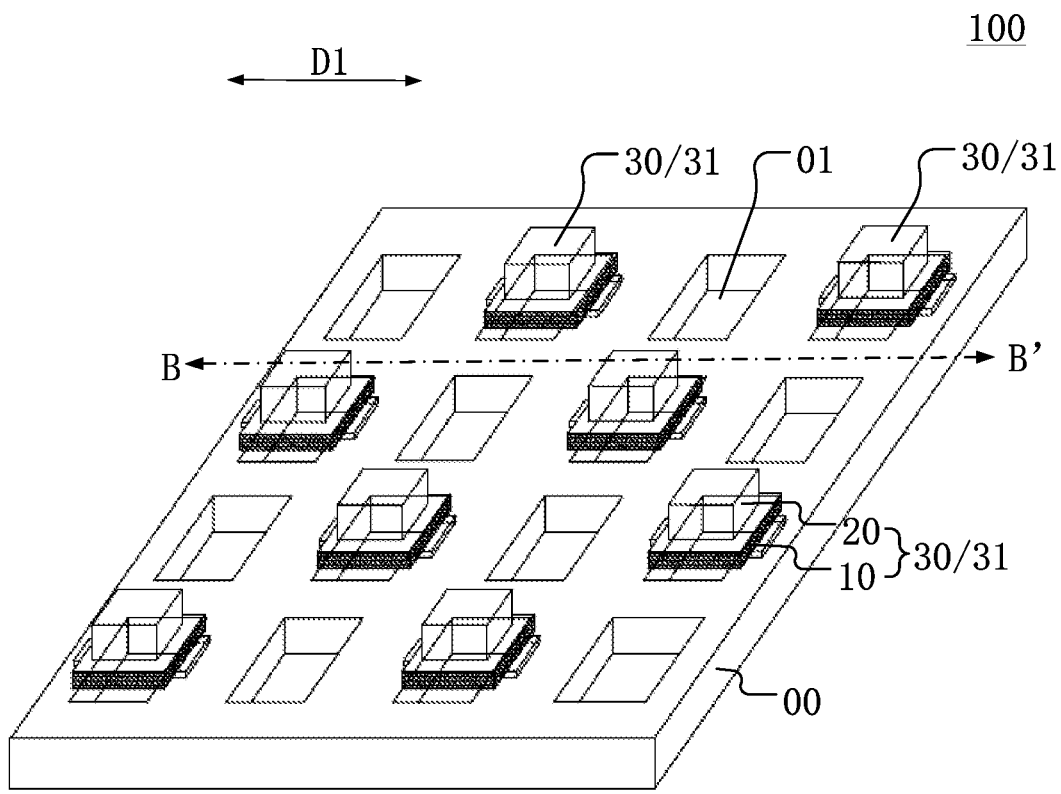
FIG. 2 illustrates a schematic diagram of an exemplary stretchable display panel in a first contracted state consistent with disclosed embodiments of the present disclosure.
Figure 3:
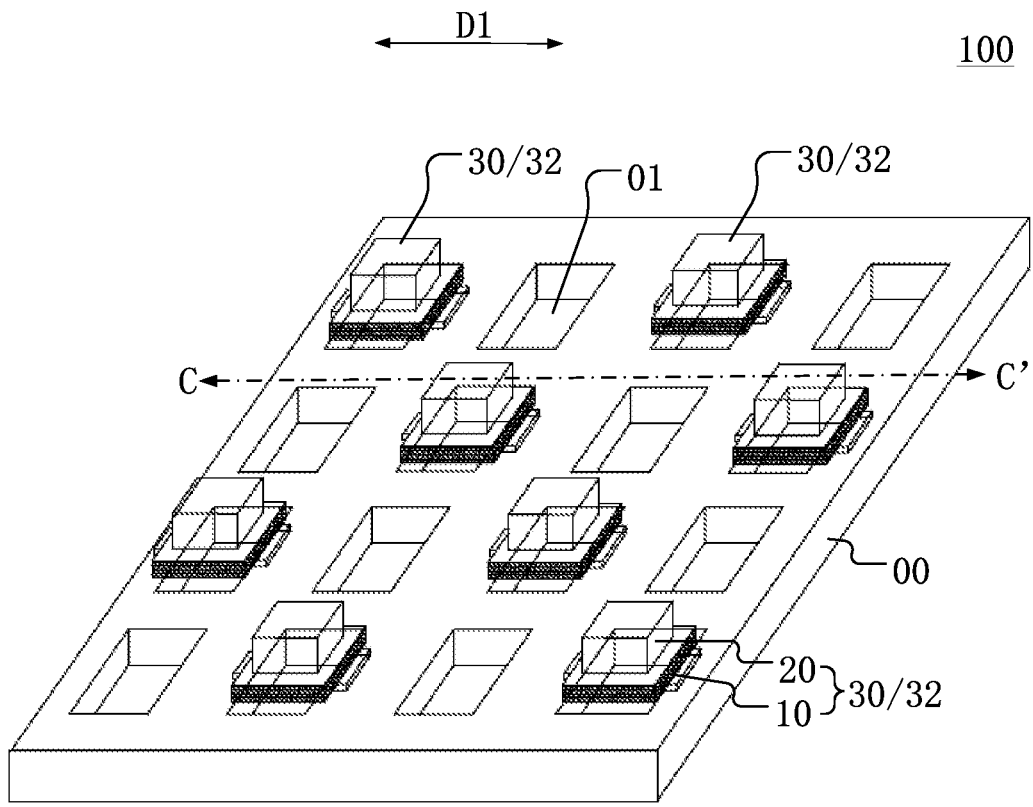
FIG. 3 illustrates a schematic diagram of an exemplary stretchable display panel in a second contracted state consistent with disclosed embodiments of the present disclosure.

The present disclosure provides a stretchable display panel. FIG. 1 illustrates a schematic diagram of a stretchable display panel in a stretched state consistent with disclosed embodiments of the present disclosure; FIG. 2 illustrates a schematic diagram of a stretchable display panel in a first contracted state consistent with disclosed embodiments of the present disclosure; and FIG. 3 illustrates a schematic diagram of a stretchable display panel in a second contracted state consistent with disclosed embodiments of the present disclosure. Referring to FIGS. 1-3, a stretchable display panel 100 may include a stretchable substrate 00 and a plurality of display units 30.

Figure 4:
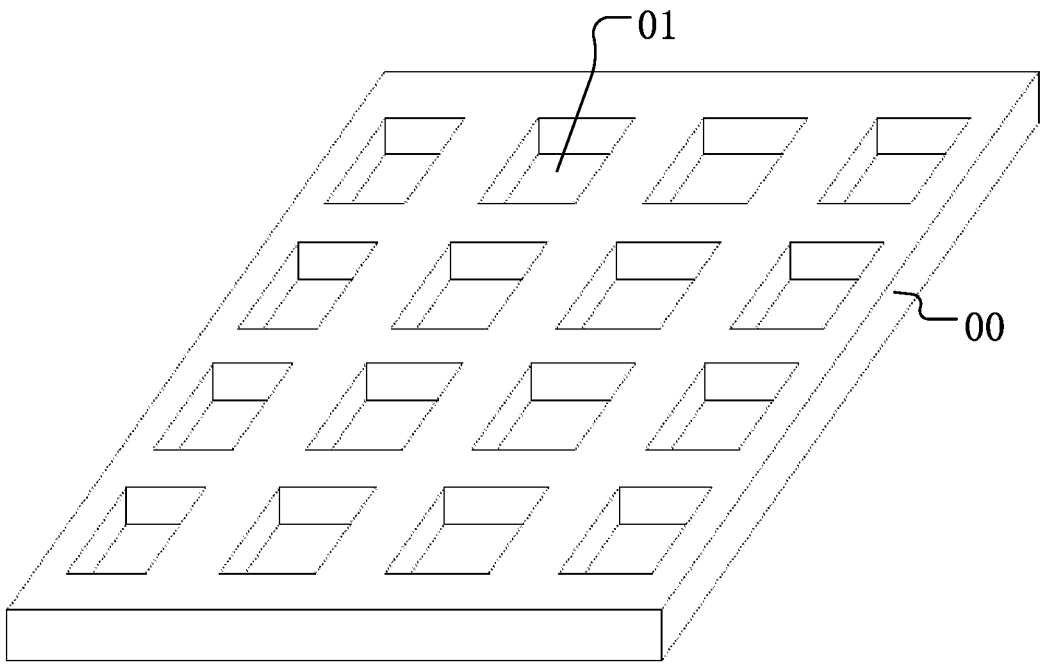
FIG. 4 illustrates a schematic diagram of an exemplary stretchable substrate consistent with disclosed embodiments of the present disclosure.

FIG. 4 illustrates a schematic diagram of the stretchable substrate consistent with disclosed embodiments of the present disclosure. Referring to FIG. 4, the stretchable substrate 00 may contain a plurality of hollows 01. Along a thickness direction of the stretchable substrate 00, the hollow 01 may penetrate through the stretchable substrate 00.

A display unit 30 may be disposed corresponding to a hollow 01. The display units 30 may include one or more first display units 31 and one or more second display units 32.

The stretchable display panel 100 may include a stretched state, a first contracted state, and a second contracted state.

Figure 5:
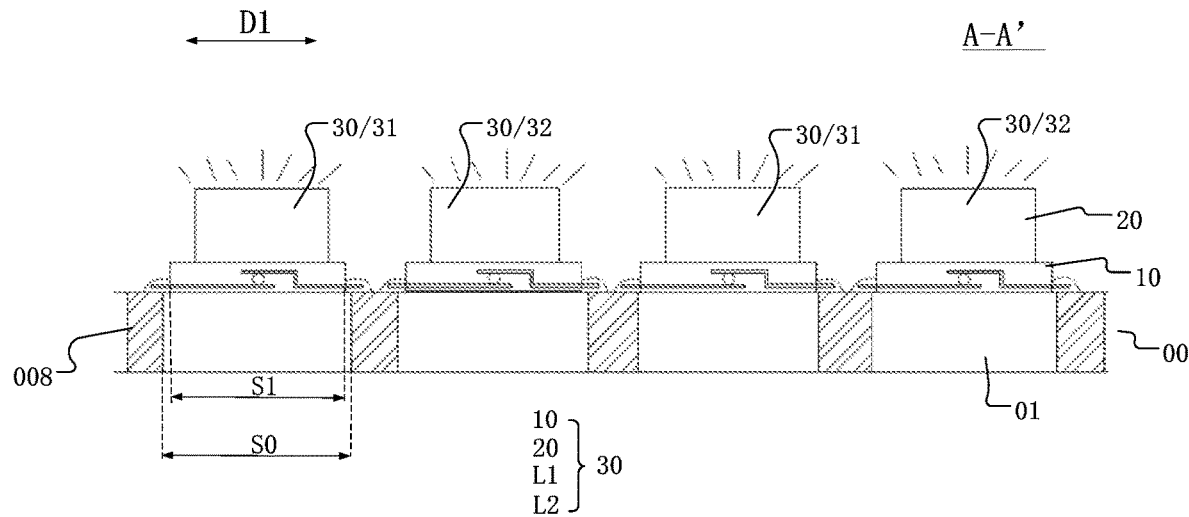
FIG. 5 illustrates a schematic A-A' sectional view of an exemplary stretchable display panel in FIG. 1 consistent with disclosed embodiments of the present disclosure.

FIG. 5 illustrates a schematic A-A' sectional view of the stretchable display panel in FIG. 1. In the stretched state, referring to FIG. 1 and FIG. 5, both the first display unit 31 and the second display unit 32 may be disposed on a side of the stretchable substrate 00 facing a light-exiting surface of the stretchable display panel 100.

Figure 6:
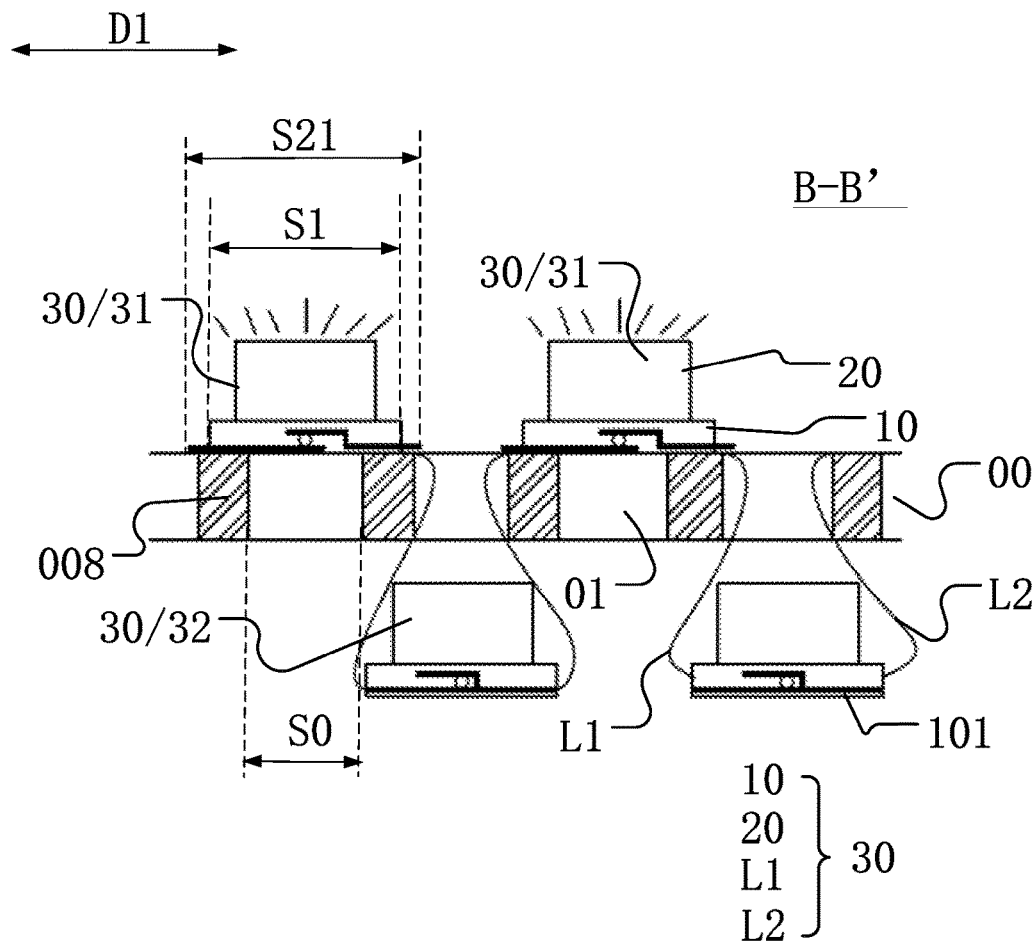
FIG. 6 illustrates a schematic B-B' sectional view of an exemplary stretchable display panel in FIG. 2 consistent with disclosed embodiments of the present disclosure.

FIG. 6 illustrates a schematic B-B' sectional view of the stretchable display panel in FIG. 2. In the first contracted state, referring to FIG. 2 and FIG. 6, the first display unit 31 may be disposed on the side of the stretchable substrate 00 facing the light-exiting surface, and the second display unit 32 may be disposed on a side of the stretchable substrate 00 away from the light-exiting surface.

Figure 7:
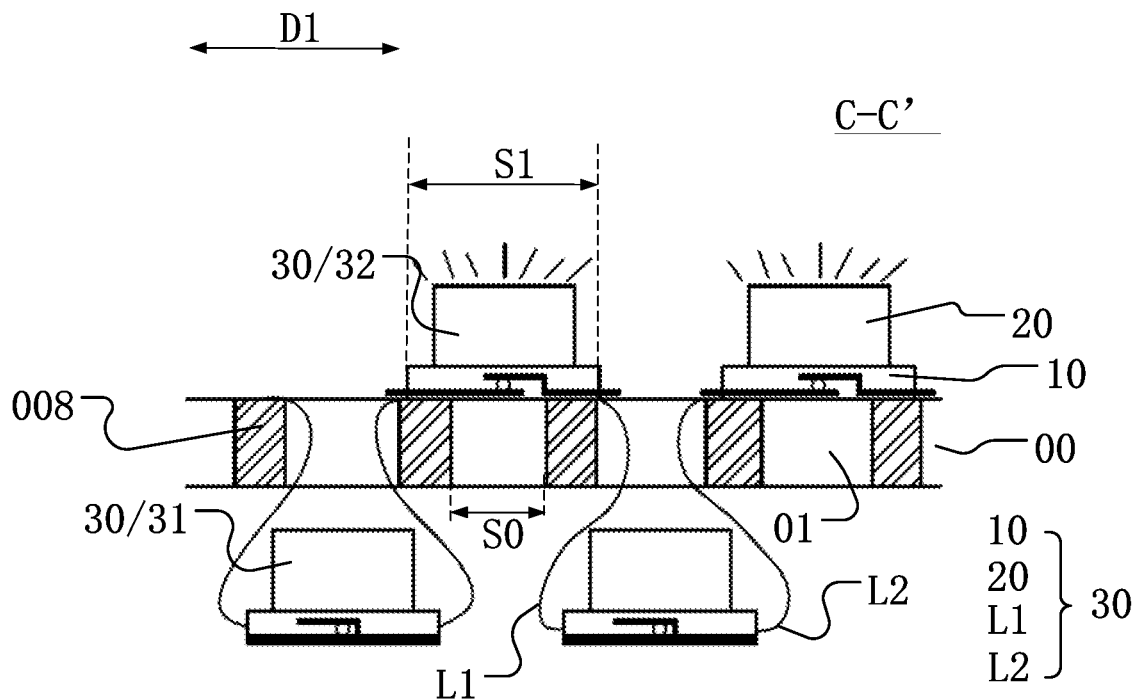
FIG. 7 illustrates a schematic C-C' sectional view of an exemplary stretchable display panel in FIG. 3 consistent with disclosed embodiments of the present disclosure.

FIG. 7 illustrates a schematic C-C' sectional view of the stretchable display panel in FIG. 3. In the second contracted state, referring to FIG. 3 and FIG. 7, the second display unit 32 may be disposed on the side of the stretchable substrate 00 facing the light-exiting surface, and the first display unit 31 may be disposed on the side of the stretchable substrate 00 away from the light-exiting surface.

The display unit 30 may be disposed corresponding to the hollow 01, which may refer to that a display unit 30 may be disposed at a position corresponding to a hollow 01. In a different state, the relative positional relationship between the display unit 30 and the corresponding hollow 01 may be different. For example, when the display unit 30 performs a display function, the display unit 30 may be disposed on the side of the corresponding hollow 01 facing the light-exiting surface; and when the display unit 30 does not perform the display function, the display unit 30 may be disposed on the side of the corresponding hollow 01 away from the light-exiting surface.

It should be noted that the light-exiting surface of the stretchable display panel may be a display surface of the stretchable display panel. In the present disclosure, the display units 30 may be divided into the first display unit 31 and the second display unit 32, which may merely represent that the positions of the first display unit 31 and the second display unit 32 in the first contracted state and the second contracted state are different, and may not represent that the first display unit 31 and the second display unit 32 have different structures. Each display unit 30 may have a same structure.

The display unit 30 may contain a display function layer to achieve the display function. In another embodiment, the display unit 30 may contain a touch-control electrode layer to achieve the touch-control function. Optionally, each display unit 30 in the present disclosure may include one or more pixels, and each pixel may include sub-pixels of at least three colors, to achieve the colorful display effect of the stretchable display panel 100.

In the first contracted state or the second contracted state, merely the first display unit 31 may be disposed on the side of the stretchable substrate 00 facing the light-exiting surface and may perform the display function, or merely the second display unit 32 may be disposed on the side of the stretchable substrate 00 facing the light-exiting surface and may perform the display function. In view of this, the size of the stretchable display panel 100 may be substantially small, and the quantity of pixels performing the display function may be substantially small.

In the stretched state, both the first display unit 31 and the second display unit 32 may be disposed on the side of the stretchable substrate 00 facing the light-exiting surface, and may perform the display function together. In view of this, the size of the stretchable substrate 00 may be substantially large, and the quantity of pixels performing the display function may be substantially large.

It should be understood that in the stretched state, when the first display unit 31 and the second display unit 32 perform the display function together, while displaying certain specific screens, not every first display unit 31 and every second display unit 32 may perform the display. In the first contracted state, when the first display unit 31 performs the display function, while displaying certain specific screens, not every first display unit 31 may perform the display. Similarly, in the second contracted state, while displaying certain specific screens, not every second display unit 32 may perform the display.

It should be noted that FIGS. 1-3 may merely illustrate an arrangement in which the first display units and the second display units are alternately arranged in the first direction and the second direction. In certain embodiments, the first display units and the second display units may be arranged in any other suitable way. For example, the first display units and the second display units may be alternately arranged in columns, and the display units in a same column may be arranged along the second direction. The display units in an odd column may be first display units, and the display units in an even column may be second display units.

In the first contracted state, the display units in the odd column may be disposed above the stretchable substrate (e.g., on the side of the stretchable substrate facing the light-exiting surface), and the display units in the even column may be disposed under the stretchable substrate (e.g., on the side of the stretchable substrate away from the light-exiting surface). In the second contracted state, the display units in the even row may be disposed above the stretchable substrate, and the display units in the odd row may be disposed under the stretchable substrate. In certain embodiments, the first display units and the second display units may be alternately arranged in rows, or may be arranged in any other suitable way, which may not be listed one by one in the present disclosure.

In an existing stretchable display panel, the display units may be divided into A-group display units and B-group display units. In a stretched state, the A-group display units and the B-group display units may perform the display function together. When displaying a certain specific screen, not every display unit of the A-group display units and every display unit of the B-group display units may perform the display function. In the contracted state, merely the A-group display units may perform the display function (when displaying a certain specific screen, not every display unit of the A-group display units may perform the display function), while the B-group display units may not perform the display function. In view of this, at least part of the A-group display units may always emit light and perform the display function no matter in the stretched state or the contracted state, while the B-group display units may merely emit light and perform the display function in the stretched state. Therefore, the difference in luminous period between the A-group display units and the B-group display units may become larger and larger over time, which may cause the service life of the A-group display units to be shorter than the service life of the B-group display units. Therefore, the difference in display effects of the A-group display units and the B-group display units in the stretched state may be significantly large, thereby affecting the display effect, and the service life of the entire stretchable display panel may be reduced.

In the present disclosure, referring to FIGS. 1-7, in the first contracted state and the second contracted state, the first display unit 31 and the second display unit 32 may be located at different positions. In the first contracted state, the first display unit 31 may be located on the side of the stretchable substrate 00 facing the light-exiting surface, and the second display unit 32 may be located on the side of the stretchable substrate 00 away from the light-exiting surface. In view of this, the first display unit 31 may perform the display function, and the second display unit 32 may not perform the display function. In the second contracted state, the second display unit 32 may be located on the side of the stretchable substrate 00 facing the light-exiting surface, and the first display unit 31 may be located on the side of the stretchable substrate 00 away from the light-exiting surface. In view of this, the second display unit 32 may perform the display function, and the first display unit 31 may not perform the display function.

Therefore, in different contracted states, the display units 30 that perform the display function may be different, which may effectively prevent merely the fixed display units from performing the display function in the contracted state, may prevent the service life of the fixed display units from being reduced, may prevent the overall service life of the display panel from being reduced, and may prevent the occurrence of difference in display effects. Therefore, in the disclosed stretchable display panel, the service life of the first display unit 31 and the second display unit 32 may be balanced, the display consistency of the first display unit 31 and the second display unit 32 may be improved, and the overall service life of the stretchable display panel may be improved.

It should be noted that FIGS. 1-7 may illustrate that the display unit 30 in the stretchable display panel may have a cuboid structure as an example. In certain embodiments, the display unit 30 may have a cylinder structure, or a cube structure, which may not be specifically limited by the present disclosure. In addition, FIGS. 1-3 may merely illustrate a relative positional relationship between the stretchable substrate 00 and the display units 30 in the stretched state, the first contracted state, and the second contracted state, respectively, which may not represent the quantity of display units 30 in the stretchable display panel 100, and may not represent the size of the stretchable substrate 00 and the display unit 30.

In an optional embodiment, referring to FIGS. 5-7, the display unit 30 may include a substrate 10 and a display structure 20 disposed on the side of the substrate 10 facing the light-exiting surface. At least one display unit 30 may include a first elastic lead L1 and a second elastic lead L2. A first end of the first elastic lead L1 and a first end of the second elastic lead L2 may be fixed to the two sides of the substrate 10 along the first direction D1, respectively. A second end of the first elastic lead L1 and a second end of the second elastic lead L2 may be fixed to two sides of the hollow 01 corresponding to the display unit 30 along the first direction D1, respectively, and may be disposed on the side of the stretchable substrate 00 facing the light-exiting surface. The first direction D1 may be a stretching direction of the stretchable substrate 00.

It should be noted that, referring to FIG. 1 and FIGS. 5-7, the stretching direction of the stretchable substrate may be a row direction shown in FIG. 1. In view of this, the first elastic lead and the second elastic lead may be disposed on both sides of the substrate along the row direction. In another embodiment, the stretching direction of the stretchable substrate may be a column direction. In view of this, the first elastic lead and the second elastic lead may be disposed on both sides of the substrate along the column direction. Further, elastic leads may be simultaneously disposed on both sides of the substrate along the row direction and on both sides of the substrate along the column direction. Therefore, the stretchable display panel may not only be stretchable along the row direction, but also be stretchable along the column direction, which may not be limited by the present disclosure. For illustrative purposes, the stretching direction may be a row direction as an example.

In one embodiment, referring to FIGS. 5-7, in different states, the states of the first elastic lead L1 and the second elastic lead L2 may be different. In the first contracted state as shown in FIG. 6, the first elastic lead L1 and the second elastic lead L2 in the second display unit 32 may pull the display structure 20, and such portion of the display structure 20 may be disposed on the side of the stretchable substrate 00 away from the light-exiting surface. The first elastic lead L1 and the second elastic lead L2 corresponding to such portion of the display structure 20 may be overall stretched in a direction pointing from the stretchable substrate 00 to the second display unit 32.

In another embodiment, when the stretchable display panel 100 changes from the first contracted state shown in FIG. 6 to the stretched state shown in FIG. 5, because the second end of the first elastic lead L1 and the second end of the second elastic lead L2 are fixed to two sides of the hollow 01 along the first direction D1, when the stretchable substrate 00 is subjected to a stretching force in the first direction D1, the hollow 01 may also be stretched, which may drive the first elastic lead L1 and the second elastic lead L2 in the second display unit 32 to be deformed. The first elastic lead L1 and the second elastic lead L2 in the second display unit 32 may drive the display structure 20 to move toward the light-exiting surface. When the first elastic lead L1 and the second elastic lead L2 shrink, the display structure 20 corresponding to the first elastic lead L1 and the second elastic lead L2 may penetrate through the corresponding hollow 01 and may reach the side of the stretchable substrate 00 facing the light-exiting surface. Therefore, both the first display unit 31 and the second display unit 32 may be disposed on the side of the stretchable substrate 00 facing the light-exiting surface and may perform the display function together, and a quantity of pixels of the stretchable display panel 100 in the stretched state may increase while stretching is achieved.

Figure 8:
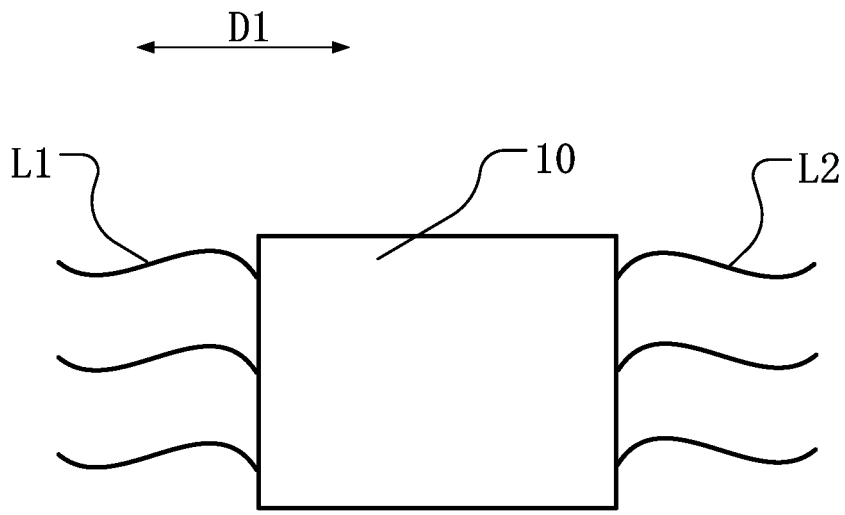
FIG. 8 illustrates a schematic diagram of a substrate and an elastic lead fixed to the substrate in an exemplary display unit consistent with disclosed embodiments of the present disclosure.

It should be noted that the cross-sectional views shown in FIGS. 5-7 may merely illustrate one first elastic lead L1 and one second elastic lead L2 that are fixed to the display structure 20. To improve the fixed reliability of the first elastic lead L1 and the second elastic lead L2 in the display unit 30, more than one first elastic leads L1 and more than one second elastic leads L2 may be fixed to a same display structure 20. FIG. 8 illustrates a schematic diagram of the substrate and an elastic lead fixed to the substrate in the display unit. For example, referring to FIG. 8, one display unit may include three first elastic leads L1 and three second elastic leads L2. First ends of the three first elastic leads L1 and first ends of the three second elastic leads L2 may be fixed on opposite sides of the substrate 10 along the first direction D1, respectively. When being switched from the stretched state to the first contracted state or the second contracted state, or when being switched from the first contracted state or the second contracted state to the stretched state, the plurality of first elastic leads L1 and the plurality of second elastic leads L2 may work together to maintain the display structure to be disposed on the side of the substrate facing the light-exiting surface, which may improve the display reliability of the stretchable display panel in the stretched state and the contracted state.

In an optional embodiment, referring to FIG. 6 and FIG. 7, in a same display unit 30, the first elastic lead L1 and the second elastic lead L2 may have a same length.

In one embodiment, through configuring the first elastic lead L1 and the second elastic lead L2 of the same display unit 30 to have the same length, it may be ensured that the elastic leads exert a same force on the substrate 10 during the deformation process. Therefore, when being switched from the stretched state to the first contracted state or the second contracted state, or when being switched from the first contracted state or the second contracted state to the stretched state, the first elastic lead L1 and the second elastic lead L2 may drive the display structure 20 to move smoothly.

In an optional embodiment, referring to FIG. 6 and FIG. 7, in the same display unit 30, the first elastic lead L1 and the second elastic lead L2 may have the same elastic modulus. In view of this, when the stretchable display panel is subjected to a stretching force or a contraction force, the first elastic lead L1 and the second elastic lead L2 may be subjected to a same stretching force and a same stretching amplitude. Therefore, the forces and displacements subjected to the two sides of the substrate 10 from the first elastic lead L1 and the second elastic lead L2 may be the same, which may facilitate to ensure that the substrate 10 and the display structure 20 move substantially stably in the stretching process or shrinking process of the stretchable display panel, and may facilitate to improve the display reliability of the stretchable display panel in different states.

It should be noted that FIGS. 5-7 may merely illustrate a case in which the second end of the first elastic lead L1 and the second end of the second elastic lead L2 in the display unit are fixed to both sides of the hollow 01. In certain embodiments, the second end of the first elastic lead L1 and the second end of the second elastic lead L2 in a same display unit may be fixed to two display units 30 adjacent to the same display unit 30 along the first direction.

Figure 9:
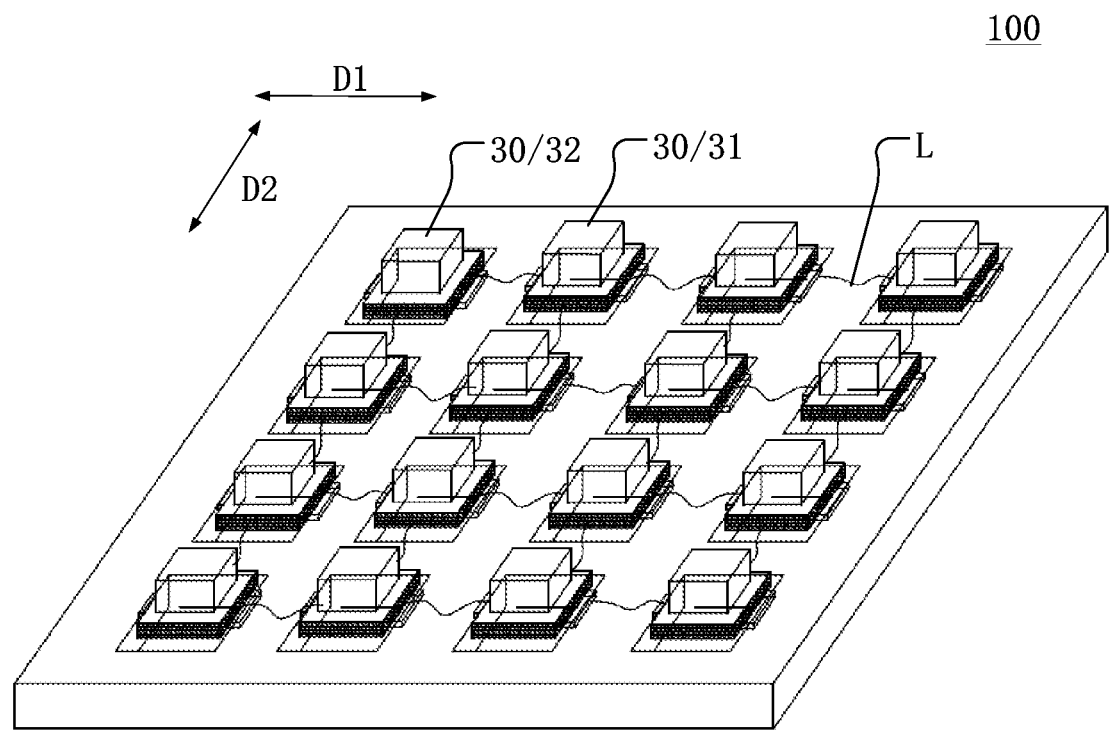
FIG. 9 illustrates a schematic diagram of another exemplary stretchable display panel in a stretched state consistent with disclosed embodiments of the present disclosure.
Figure 10:
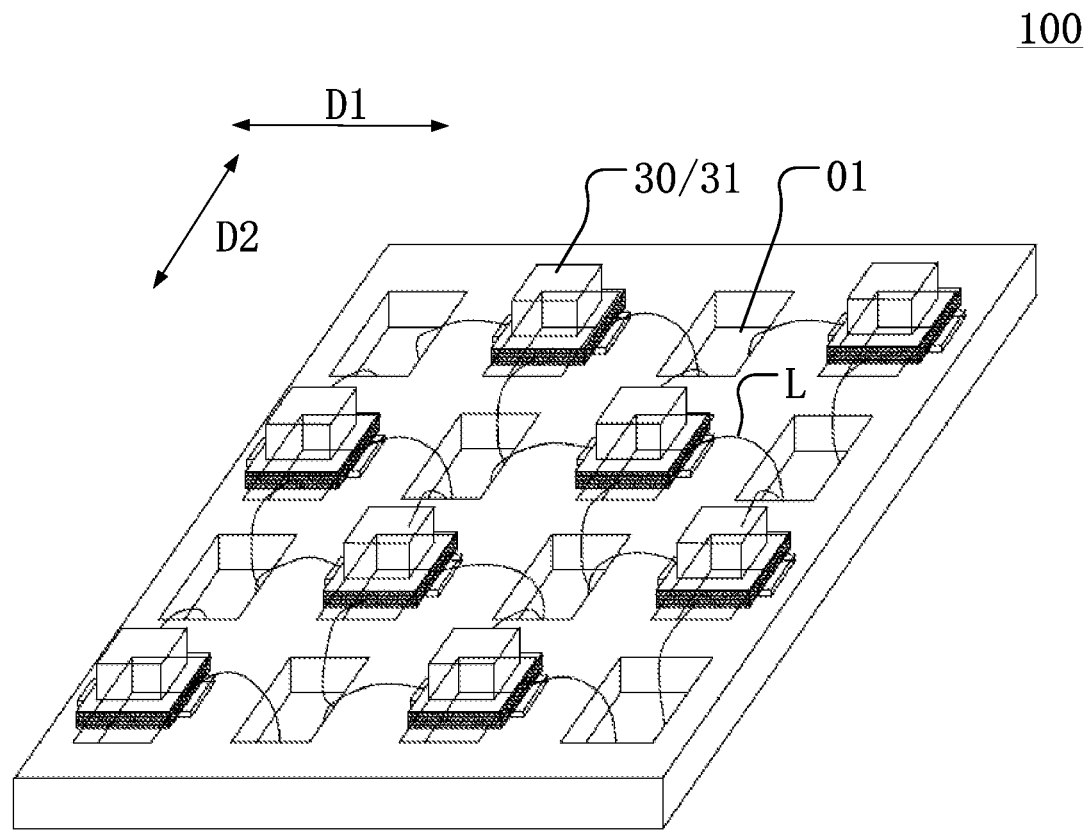
FIG. 10 illustrates a schematic diagram of another exemplary stretchable display panel in a first contracted state consistent with disclosed embodiments of the present disclosure.

FIG. 9 illustrates a schematic diagram of another stretchable display panel in a stretched state consistent with disclosed embodiments of the present disclosure; and FIG. 10 illustrates a schematic diagram of another stretchable display panel in the first contracted state consistent with disclosed embodiments of the present disclosure. For example, referring to FIG. 9 and FIG. 10, along the first direction, the substrates of two adjacent display units may be connected to a same elastic lead L. In the stretched state, the elastic lead L may be in a contracted state, and each display unit and the elastic lead L connecting the display unit may be disposed on the side of the stretchable substrate facing the light-exiting surface. In the first contracted state, the first display unit 31 may be located on the side of the stretchable substrate facing the light-exiting surface, and the second display unit 32 may be located on the side of the stretchable substrate away from the light-exiting surface. Therefore, the elastic lead L connecting the adjacent first display unit 31 and the second display unit 32 may be in a stretched state. The elastic lead L may penetrate through the hollow, one end of the elastic lead L may be connected to the substrate of the first display unit 31, and the other end of the elastic lead L may be connected to the substrate of the second display unit 32.

Optionally, in certain embodiments, referring to FIG. 9 and FIG. 10, in addition to the elastic leads arranged on both sides of the substrate along the first direction, the display unit may further include elastic leads arranged on both sides of the substrate along the second direction. Therefore, when being switched from the stretched state to the contracted state, or from the contracted state to the stretched state, the fixed reliability of the display unit may be effectively improved, which may ensure that the display structure in each display unit 30 may be disposed on the side of the substrate facing the light-exiting surface to improve the display reliability of the display panel.

It should be noted that, in the disclosed display panel, when adjacent two display units along the first direction are connected to a same elastic lead, for example, referring to FIG. 9 and FIG. 10, the elastic lead may also be multiplexed as a signal transmission line that transmits signals to the display unit. Optionally, the signal transmission line may be multiplexed as a scanning line of the display panel, to transmit a scanning signal to the corresponding pixel in the display unit. The signal transmission line may include an elastic substrate and an electrical connection line disposed on the elastic substrate. The elastic substrate may be made of a flexible resin material such as polyimide, and the electrical connection line may be made of a liquid metal material or a conductive material with desired ductility such as nano-silver. In certain embodiments, when one end of the elastic lead is connected to the display unit and the other end of the elastic lead is connected to the stretchable substrate, an electrical connection medium may be provided on the stretchable substrate to make the elastic leads between the adjacent two display units be electrically connected, such that the transmission of electrical signal may be achieved through the elastic leads.

In an optional embodiment, referring to FIGS. 5-7, the display unit 30 may include the substrate 10 and the display structure 20 disposed on the side of the substrate 10 facing the light-exiting surface. In the stretched state, along the first direction D1, the width of the hollow 01 may be greater than the width of the substrate 10 in the corresponding display unit 30. In the first contracted state and the second contracted state, along the first direction D1, the width of the hollow 01 may be smaller than the width of the substrate 10 in the corresponding display unit 30. In a same display unit 30, the width of the substrate 10 may be greater than or equal to the width of the display structure 20, and the first direction D1 may be the stretching direction of the stretchable substrate 00.

In one embodiment, referring to FIG. 5, in the stretched state, along the first direction D1, the overall width of the stretchable display panel may become larger, and the width of the hollow 01 may become larger. Both the first display unit 31 and the second display unit 32 may be disposed on the side of the stretchable substrate 00 facing the light-exiting surface. In view of this, the width S0 of the hollow 01 may be set to be greater than the width S1 of the substrate 10 in the corresponding display unit 30. Therefore, when the stretchable display panel is switched from the stretched state to the first contracted state, the second display unit 32 may be capable of penetrating through the corresponding hollow 01 and move to the side of the stretchable substrate 00 away from the light-exiting surface.

As the stretchable display panel shrinks, the width of the hollow 01 may gradually decrease. Referring to FIG. 6, in the first contracted state, the width S0 of the hollow 01 along the first direction D1 may be smaller than the width S1 of the substrate 10 in the corresponding display unit 30, which may ensure that the first display unit 31 is maintained on the side of the stretchable substrate 00 facing the light-exiting surface, may ensure that the second display unit 32 is maintained on the side of stretchable substrate 00 away from the light-exiting surface, and may effectively reduce the area of the stretchable display panel.

Similarly, when the stretchable display panel is switched from the stretched state to the second contracted state, referring to FIG. 7, the first display unit 31 may be capable of penetrating through the corresponding hollow 01 and move to the side of the stretchable substrate 00 away from the light-exiting surface. As the stretchable display panel shrinks, the width of the hollow 01 may gradually decrease. In the second contracted state, the width S0 of the hollow 01 along the first direction D1 may be smaller than the width S1 of the substrate 10 in the corresponding display unit 30, which may ensure that the second display unit 32 is maintained on the side of the stretchable substrate 00 facing the light-exiting surface, and may ensure that the first display unit 31 is maintained on the side of the stretchable substrate 00 away from the light-exiting surface.

In one embodiment, referring to FIG. 1 and FIG. 5, in the stretched state, at least part of the first display units 31 and the second display units 32 may be alternately arranged.

Specifically, in the stretched state, both the first display unit 31 and the second display unit 32 may be disposed on the side of the stretchable substrate 00 facing the light-exiting surface, and the first display unit 31 and the second display unit 32 may perform display together. Referring to FIG. 1, at least part of the first display units 31 and the second display units 32 may be alternately arranged. In other words, along the first direction D1, one second display unit 32 may be disposed between any two adjacent first display units 31, or one first display unit 31 may be disposed between any two adjacent second display units 32; and along the second direction D2, one second display unit 32 may be disposed between any two adjacent first display units 31, or one first display unit 31 may be disposed between any two adjacent second display units 32, where the second direction D2 may intersect the first direction D1.

In the embodiment associated with FIG. 1, the first direction D1 may be embodied as a row direction, and the second direction may be embodied as a column direction. When the first display units 31 and the second display units 32 are alternately arranged, in the first contracted state, the first display units 31 that perform the display function in the stretchable display panel 100 may be evenly distributed. In the second contracted state, the second display units 32 that perform the display function in the stretchable display panel 100 may be evenly distributed. Therefore, the display uniformity of the stretchable display panel 100 in the first contracted state and the second contracted state may be improved, which may facilitate to improve the display effect of the stretchable display panel 100 in the first contracted state and the second contracted state.

Figure 11:
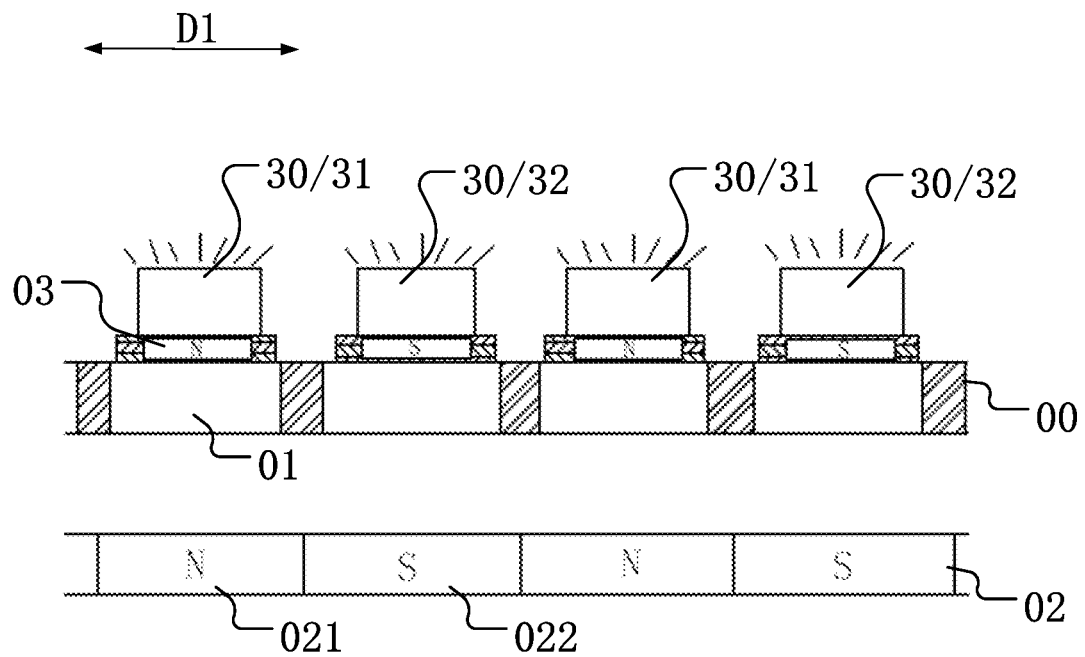
FIG. 11 illustrates a schematic diagram of an exemplary stretchable display panel including a stretchable magnetic substrate consistent with disclosed embodiments of the present disclosure.

FIG. 11 illustrates a schematic diagram of a stretchable display panel including a stretchable magnetic substrate consistent with disclosed embodiments of the present disclosure. In an optional embodiment, the corresponding stretchable display panel may be in a stretched state. The stretchable display panel may further include a stretchable magnetic substrate 02, and the display unit 30 may further include a magnetic component 03. The stretchable magnetic substrate 02 may be disposed on a side of the display unit 30 away from the light-exiting surface.

The stretchable magnetic substrate 02 may include a plurality of first regions 021 and a plurality of second regions 022. The orthographic projection of the magnetic component 03 of the first display unit 31 on the plane of the stretchable magnetic substrate 02 may be located in the first region 021, and the orthographic projection of the magnetic component 03 of the second display unit 32 on the plane of the stretchable magnetic substrate 02 may be located in the second region 022.

In the stretched state, referring to FIG. 11, a magnetic pole of the first region 021 of the stretchable magnetic substrate 02 and a magnetic pole of the magnetic component 03 corresponding to the first region 021 that face each other may be the same. A magnetic pole of the second region 022 of the stretchable magnetic substrate 02 and a magnetic pole of the magnetic component 03 corresponding to the second region 022 that face each other may be the same.

Figure 12:
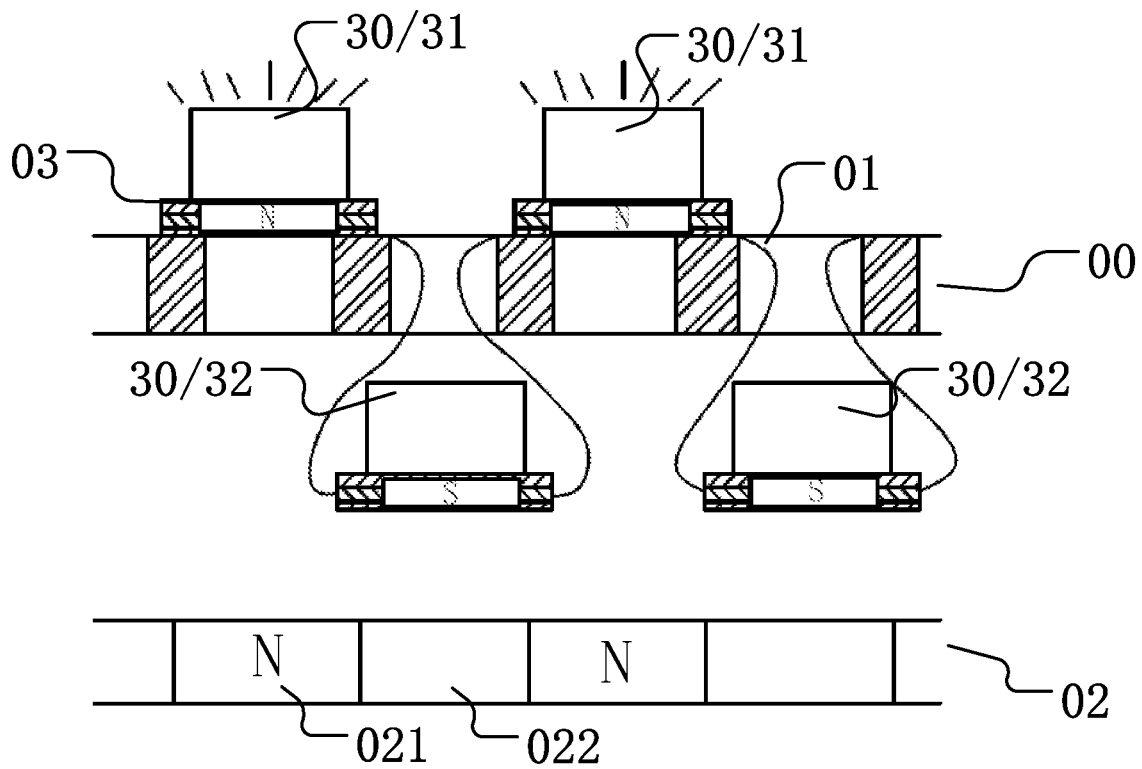
FIG. 12 illustrates a schematic diagram of another exemplary stretchable display panel including a stretchable magnetic substrate consistent with disclosed embodiments of the present disclosure.
Figure 13:
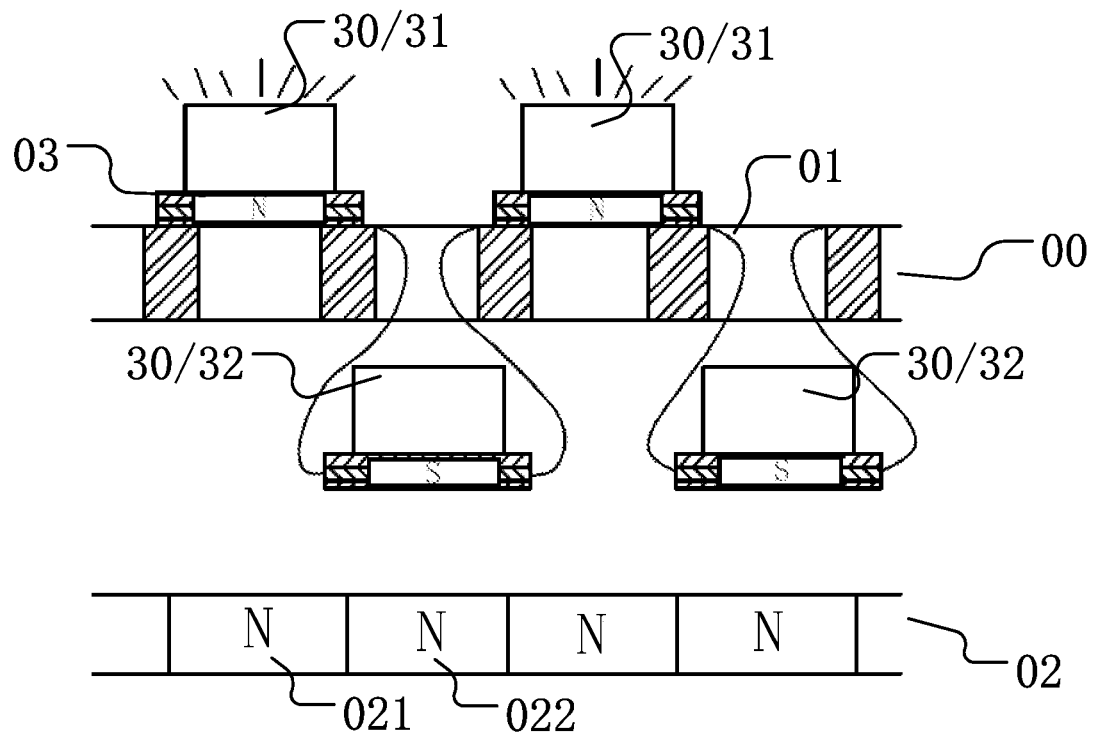
FIG. 13 illustrates a schematic diagram of another exemplary stretchable display panel including a stretchable magnetic substrate consistent with disclosed embodiments of the present disclosure.

FIG. 12 illustrates a schematic diagram of a stretchable display panel including a stretchable magnetic substrate consistent with disclosed embodiments of the present disclosure; and FIG. 13 illustrates a schematic diagram of another stretchable display panel including a stretchable magnetic substrate consistent with disclosed embodiments of the present disclosure. In the first contracted state, referring to FIG. 12, the magnetic pole of the first region 021 of the stretchable magnetic substrate 02 and the magnetic pole of the magnetic component 03 corresponding to the first region 021 that face each other may be the same. At least one of the second region 022 and the magnetic component 03 corresponding to the second region 022 may not be magnetic. For example, the magnetism of the second region 022 may be removed, or the magnetism of the magnetic component 03 corresponding to the second region 022 may be removed. For illustrative purposes, FIG. 12 merely illustrates that the magnetism of the second region 022 may be removed as an example.

Referring to FIG. 13, the magnetic pole of the second region 022 of the stretchable magnetic substrate 02 and the magnetic pole of the magnetic component 03 corresponding to the second region 022 that face each other may be opposite. For example, the magnetic pole of the second region 022 may be North Pole (N), and the magnetic pole of the corresponding magnetic component 03 may be South Pole (S). In certain embodiments, the magnetic pole of the magnetic component 03 corresponding to the second region 022 may be North Pole (N), and the magnetic pole of the second region 022 may be South Pole (S). The stretchable display panel corresponding to any one of FIG. 12 and FIG. 13 may be in the first contracted state.

Figure 14:
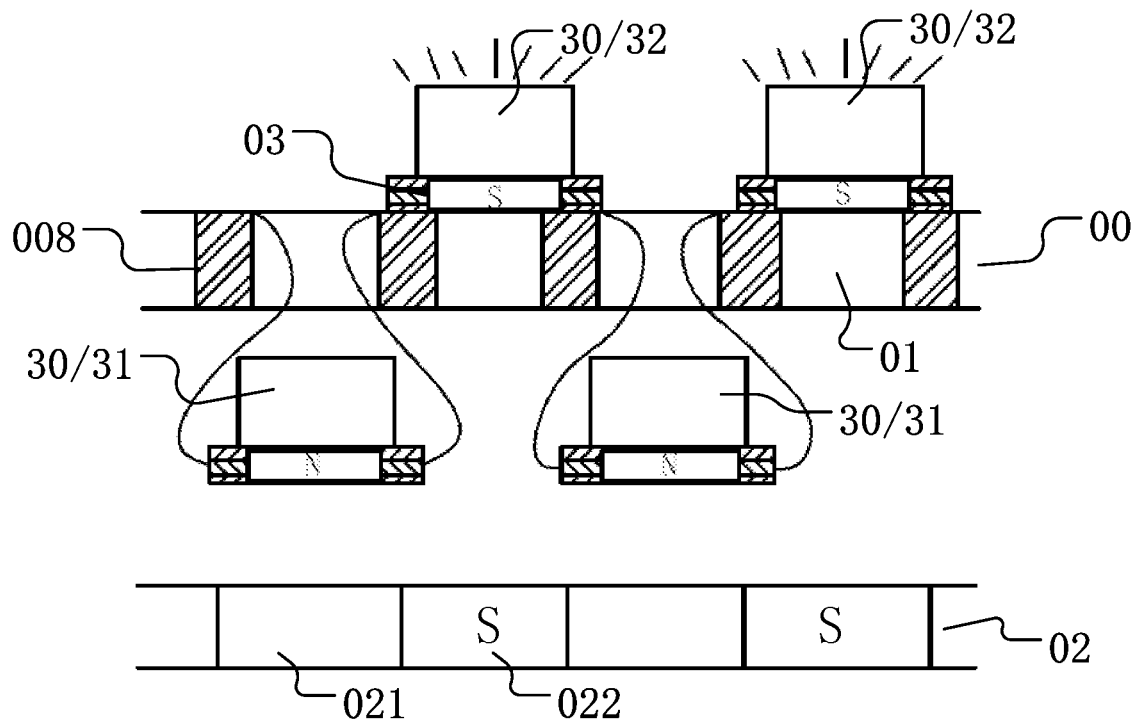
FIG. 14 illustrates a schematic diagram of another exemplary stretchable display panel including a stretchable magnetic substrate consistent with disclosed embodiments of the present disclosure.
Figure 15:
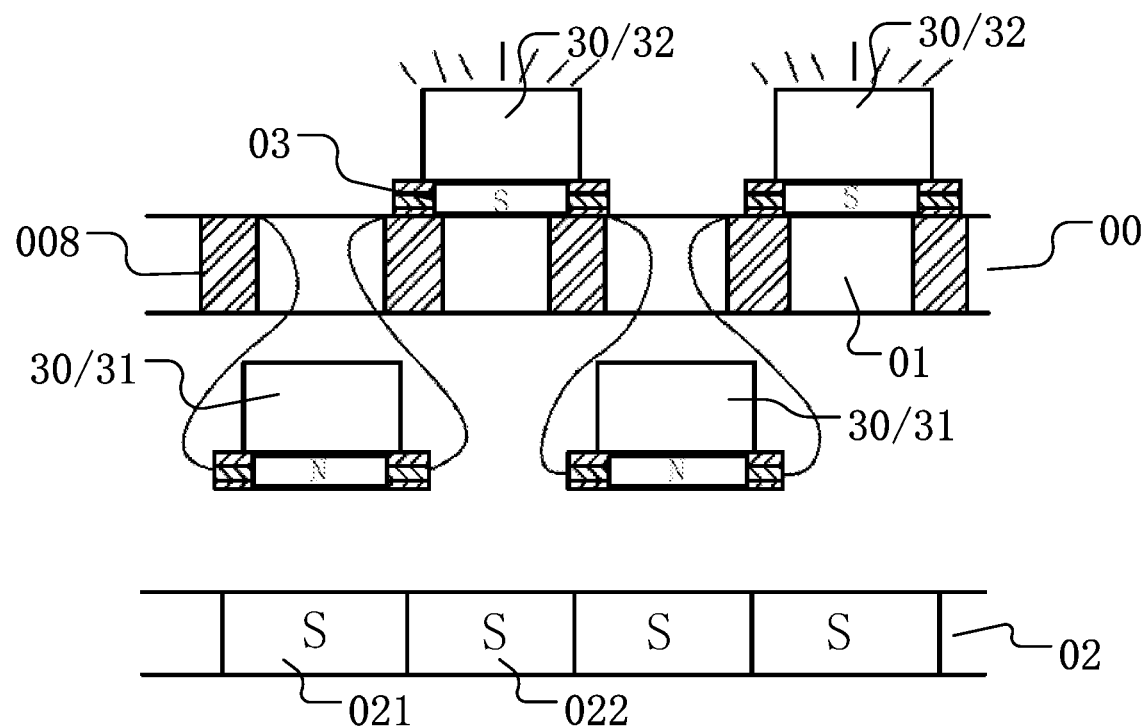
FIG. 15 illustrates a schematic diagram of another exemplary stretchable display panel including a stretchable magnetic substrate consistent with disclosed embodiments of the present disclosure.

FIG. 14 illustrates a schematic diagram of another stretchable display panel including a stretchable magnetic substrate consistent with disclosed embodiments of the present disclosure; and FIG. 15 illustrates a schematic diagram of another stretchable display panel including a stretchable magnetic substrate consistent with disclosed embodiments of the present disclosure. In the second contracted state, referring to FIG. 14, the magnetic pole of the second region 022 of the stretchable magnetic substrate 02 and the magnetic pole of the magnetic component 03 corresponding to the second region 022 that face each other may be the same, and may be South Pole (S). In certain embodiments, both the magnetic pole of the second region 022 and the magnetic pole of the magnetic component 03 corresponding to the second region 022 that face each other may be North Pole (N). At least one of the first region 021 and the magnetic component 03 corresponding to the first region 021 may not be magnetic. For example, the magnetism of the first region 021 may be removed, or the magnetism of the magnetic component 03 corresponding to the first region 021 may be removed. For illustrative purposes, FIG. 14 merely illustrates that the magnetism of the first region 021 may be removed as an example.

In another embodiment, referring to FIG. 15, the magnetic pole of the first region 021 of the stretchable magnetic substrate 02 and the magnetic pole of the magnetic component 03 corresponding to the first region 021 that face each other may be opposite. For example, the magnetic pole of the first region 021 may be South Pole (S), and the magnetic pole of the corresponding magnetic component 03 may be North Pole (N). In certain embodiments, the magnetic pole of the magnetic component 03 corresponding to the first region 021 may be South Pole (S), and the magnetic pole of the first region 021 may be North Pole (N). The stretchable display panel corresponding to any one of FIG. 14 and FIG. 15 may be in the second contracted state.

Figure 16:
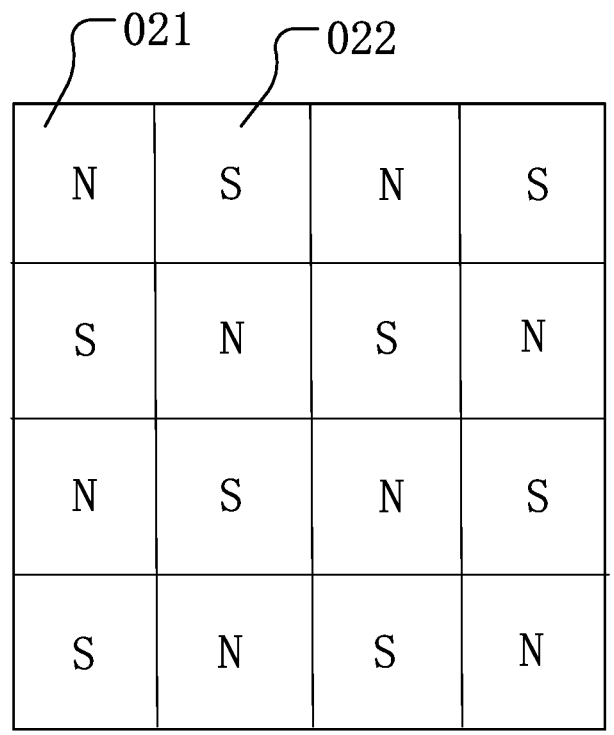
FIG. 16 illustrates a schematic top view of an exemplary stretchable magnetic substrate consistent with disclosed embodiments of the present disclosure.

In certain embodiments, referring to FIGS. 11-15, the stretchable display panel 100 may include the stretchable magnetic substrate 02, and the display unit 30 may include the magnetic component 03. The specific position of the display unit 30 in a different state may be controlled by the magnetic force between the stretched magnetic substrate 02 and the magnetic component 03. FIG. 16 illustrates a schematic diagram of a stretchable magnetic substrate consistent with disclosed embodiments of the present disclosure. The stretchable magnetic substrate 02 may include a plurality of magnetic regions, which may correspond to the plurality of first regions 021 and the plurality of second regions 022, respectively. The magnetic properties of the first region 021 and the second region 022 may be respectively controlled.

Referring to FIGS. 11-15, along a direction perpendicular to the stretchable magnetic substrate 02, the first region 021 and the magnetic component 03 in the first display unit 31 may be disposed up and down in a vertical direction, and the second region 022 and the magnetic component 03 corresponding to the second region 022 may be disposed up and down in the vertical direction. Optionally, each magnetic region of the stretchable magnetic substrate 02 may be provided with an electromagnet, and the magnetic component 03 in the display unit may also be provided with an electromagnet. The magnetism of each magnetic region may be controlled by energizing the electromagnet in each magnetic region, and the magnetism of the magnetic component 03 in the display unit may be controlled by energizing the electromagnet in the magnetic component 03 in the display unit.

For example, when the electromagnet is energized, the corresponding magnetic region or magnetic component may generate magnetism. When the electromagnet is not energized, the corresponding magnetic region or magnetic component may not generate magnetism. In addition, the strength of the magnetism of each magnetic region and magnetic component may be controlled by the amplitude of current flowing through the electromagnet in each magnetic region or magnetic component. The North Pole (N) and South Pole (S) of each magnetic region and magnetic component may be controlled by a direction of the current.

In the stretched state, referring to FIG. 11, the magnetic pole of the first region 021 and the magnetic pole of the magnetic component 03 corresponding to the first region 021 that face each other may be the same, and the magnetic pole of the second region 022 and the magnetic pole of the magnetic component 03 corresponding to the second region 022 that face each other may be the same. Because of the attraction between opposite poles and repulsion between similar poles, the first region 021 of the stretchable magnetic substrate 02 may provide a thrust toward the light-exiting surface for the corresponding first display unit 31, and the second region 022 may provide a thrust toward the light-exiting surface for the corresponding second display unit 32. Therefore, the first display unit 31 and the second display unit 32 may be controlled to be disposed on the side of the stretchable substrate 00 facing the light-exiting surface.

In the first contracted state, referring to FIGS. 12-13, the magnetic pole of the first region 021 and the magnetic pole of the magnetic component 03 of the first display unit 31 corresponding to the first region 021 that face each other may be the same. Because of repulsion between similar poles, the first region 021 of the stretchable magnetic substrate 02 may continuously provide a thrust toward the light-exiting surface for the first display unit 31, such that the first display unit 31 may be kept on the side of the stretchable substrate 00 facing the light-exiting surface. At the same time, the magnetic pole of the second region 022 and the magnetic pole of the magnetic component 03 of the second display unit 32 corresponding to the second region 022 that face each other may be opposite, or at least one of the second region 022 and the corresponding magnetic component 03 may not have magnetism. Because of the attraction between opposite poles or the action of gravity, in the first contracted state, the second display unit 32 may be displaced toward the stretchable magnetic substrate 02 and move to the side of the stretchable substrate 00 away from the light-exiting surface.

Similarly, in the second contracted state, referring to FIGS. 14-15, the magnetic pole of the second region 022 and the magnetic pole of the magnetic component 03 of the second display unit 32 corresponding to the second region 022 that face each other may be the same. Because of repulsion between similar poles, the second region 022 of the stretchable magnetic substrate 02 may provide a thrust toward the light-exiting surface for the second display unit 32, such that the second display unit 32 may be kept on the side of the stretchable substrate 00 facing the light-exiting surface. At the same time, the magnetic pole of the first region 021 and the magnetic pole of the magnetic component 03 of the first display unit 31 corresponding to the first region 021 that face each other may be opposite, or at least one of the first region 021 and the corresponding magnetic component 03 may not have magnetism. Because of the attraction between opposite poles or the action of gravity, in the second contracted state, the first display unit 31 may be displaced toward the stretchable magnetic substrate 02 and move to the side of the stretchable substrate 00 away from the light-exiting surface.

In view of this, the specific positions of the first display unit 31 and the second display unit 32 in different states may be controlled by the magnetic force, and the operation mode may be simple and reliable. In the present disclosure, the stretchable display panel may be controlled to be switched from the stretched state to the contracted state through the magnetic force, and the first contracted state and the second contracted state may be alternately performed. For example, the stretchable display panel may be first switched from the stretched state to the first contracted state. After being switched from the first contracted state to the stretched state, and while being switched from the stretched state to the contracted state, the stretchable display panel may be switched to the second contracted state. In other words, the first contracted state and the second contracted state may be performed after each of adjacent two stretched states. Therefore, in different contracted states, the first display unit 31 and the second display unit 32 may alternately perform the display function, which may effectively prevent merely the fixed display units from performing the display function in the contracted state, and may prevent the service life of the fixed display units from being reduced.

In an optional embodiment, in the stretched state, magnetic poles of the magnetic components 03 of at least part of adjacent two display units 30 that face the stretchable magnetic substrate 02 may be opposite to each other. In one embodiment, referring to FIG. 11, in the stretched state, along the first direction D1, the first display unit 31 and the second display unit 32 may be alternately arranged. In other words, the display units may be arranged according to a regular pattern of the first display unit 31, the second display unit 32, the first display unit 31, and the second display unit 32, etc. The magnetic poles of the magnetic components 03 corresponding to every display unit may be arranged according to a regular pattern of NSNS, etc. In other words, the magnetic poles of the magnetic components of adjacent two display units may be opposite to each other, such that the positions of adjacent display units may be effectively distinguished by magnetism. In cooperation with the magnetism provided by the stretchable magnetic substrate 02, the position requirements of the first display unit 31 and the second display unit 32 in the stretchable display panel in different states may be satisfied.

In certain embodiments, magnetic poles of the magnetic components 03 of at least part of adjacent two display units 30 that face the stretchable magnetic substrate 02 may be the same. The first region 021 and the magnetic component 03 in the first display unit 31 may be disposed up and down in the vertical direction, and the second region 022 and the magnetic component 03 in the second display unit 32 may be disposed up and down in the vertical direction. As long as the stretchable magnetic substrate 02 is capable of attracting or repelling the magnetic components 03 in the first display unit 31 and the second display unit 32, the position switch requirements of the first display unit 31 and the second display unit 32 in different states may be satisfied.

It should be noted that when the display units of the display panel are arranged in a manner in which the first display unit and the second display unit are alternately arranged, and the magnetic poles of the magnetic components of the two adjacent display units are different, the magnetic regions of the corresponding stretchable magnetic substrate may be arranged in a manner in which the first region 021 and the second region 022 are alternately arranged as shown in FIG. 16. In certain embodiments, the magnetic components of the display units disposed in a same row along the first direction may have a same magnetic pole, and the magnetic components of the display units disposed in two adjacent rows along the second direction may have different magnetic poles. In view of this, the magnetic components of the display units disposed in the same row may correspond to a same magnetic region, which may facilitate to reduce the quantity of magnetic regions in the stretchable magnetic substrate and may simplify the complexity of controlling the magnetism of the stretchable magnetic substrate.

Similarly, the magnetic components of the display units disposed in a same column along the second direction may have the same magnetic pole, and the magnetic components of display units disposed in the two adjacent columns along the second direction may have opposite magnetic poles. Therefore, the magnetic components of the display units disposed in the same column may correspond to a same magnetic region, which may also facilitate to reduce the quantity of magnetic regions in the stretchable magnetic component.

Figure 17:
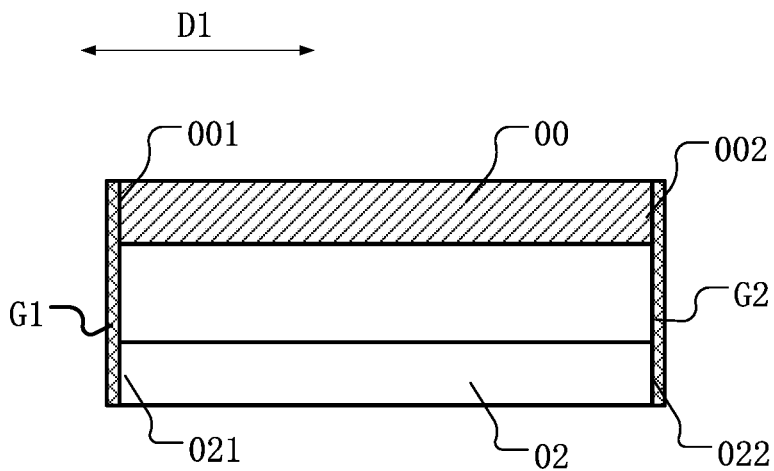
FIG. 17 illustrates a schematic diagram of a relative positional relationship between a stretchable substrate and a stretchable magnetic substrate consistent with disclosed embodiments of the present disclosure.

FIG. 17 illustrates a schematic diagram of a relative positional relationship between the stretchable substrate 00 and the stretchable magnetic substrate 02 consistent with disclosed embodiments of the present disclosure. In an optional embodiment, the stretchable magnetic substrate 02 and the stretchable substrate 00 may have a same stretch coefficient. Along the first direction D1, the stretchable substrate 00 may include a first edge 001 and a second edge 002 that are oppositely disposed, and the stretchable magnetic substrate 02 may include a third edge 021 and a fourth edge 022 that are oppositely disposed. The first edge 001 and the third edge 021 may be disposed on a same side of the stretchable display panel, and the second edge 002 and the fourth edge 022 may be disposed on a same side of the stretchable display panel. The stretchable display panel may further include a first fixing portion G1 and a second fixing portion G2 that are oppositely disposed along the first direction D1. Both the first edge 001 and the third edge 021 may be fixed to the first fixing portion G1, and both the second edge 002 and the fourth edge 022 may be fixed to the second fixing portion G2. The first direction D1 may be the stretching direction of the stretchable substrate 00.

Referring to FIG. 17, when the stretchable display panel 100 includes the stretchable magnetic substrate 02, the stretchable magnetic substrate 02 may have a same stretch coefficient as the stretchable substrate 00. Therefore, the stretchable magnetic substrate 02 may be stretched as the stretchable substrate 00 is stretched, and may have the same stretch amplitude as the stretchable substrate 00. The stretchable magnetic substrate 02 may be contracted as the stretchable substrate 00 is contracted, and may have the same contraction amplitude as the stretchable substrate 00. In view of this, referring to FIGS. 11-15, the first region 021 of the stretchable magnetic substrate 02 may always correspond to the first display unit 31, and the second region 022 of the stretchable magnetic substrate 02 may always correspond to the second display unit 32. Therefore, the accuracy of the magnetic direction and size between the first region 021 and the first display unit 31 may be ensured, and the accuracy of the magnetic direction and size between the second region 022 and the second display unit 32 may be ensured.

Figure 18:
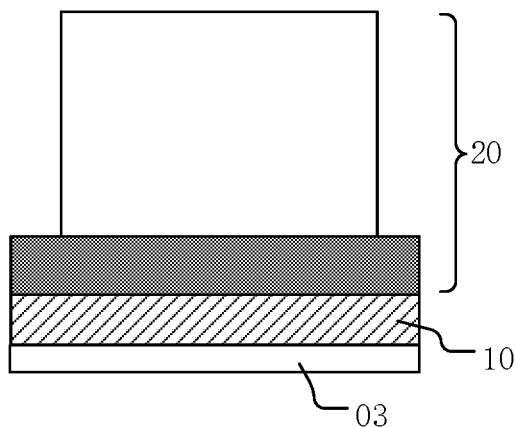
FIG. 18 illustrates a schematic diagram of a positional relationship of a magnetic component in an exemplary display unit consistent with disclosed embodiments of the present disclosure.
Figure 19:
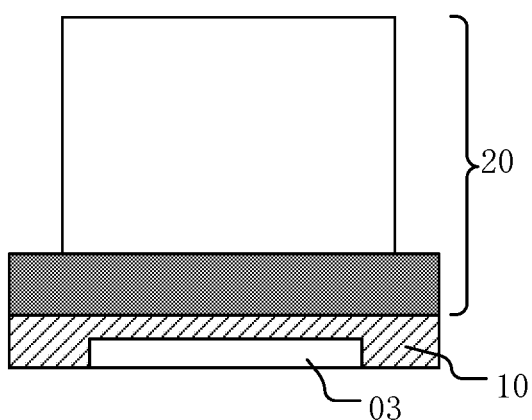
FIG. 19 illustrates a schematic diagram of a positional relationship of a magnetic component in another exemplary display unit consistent with disclosed embodiments of the present disclosure.
Figure 20:
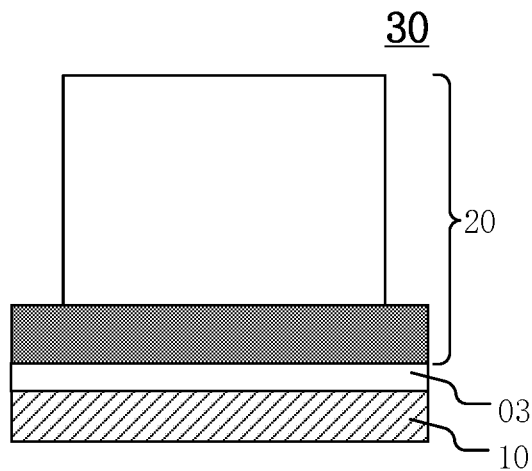
FIG. 20 illustrates a schematic diagram of a positional relationship of a magnetic component in another exemplary display unit consistent with disclosed embodiments of the present disclosure.

In an optional embodiment, FIGS. 18-20 illustrate schematic diagrams of three positional relationships of the magnetic component 03 in the display unit 30. The display unit 30 may include the substrate 10 and the display structure disposed on a side of the substrate 10 facing the light-exiting surface. Referring to FIG. 18, the magnetic component 03 may be disposed on the side of the substrate 10 away from the display structure 20. In another embodiment, referring to FIG. 19, the magnetic component 03 may be integrated into the substrate 10. In another embodiment, referring to FIG. 20, the magnetic component 03 may be disposed between the substrate 10 and the display structure 20.

Specifically, in conjunction with FIGS. 11-15, when the magnetic component 03 is disposed on the side of the substrate 10 away from the display structure 20, for example, referring to FIG. 18, a distance between the magnetic component 03 and the stretchable magnetic substrate 02 may be substantially small, and a magnetic force subjected to the magnetic component 03 from the stretchable magnetic substrate 02 may be substantially strong. Therefore, when the stretchable display panel 100 is switched between the contracted state and the stretched state, the display unit 30 may be reliably displaced. In addition to the positional relationship shown in FIG. 18, in certain embodiments, the magnetic component 03 may be integrated into the substrate 10, or the magnetic component 03 may be disposed between the substrate 10 and the display structure 20. As long as the magnetic component 03 is capable of being magnetically coupled to the stretchable magnetic substrate 02, the positional relationship of magnetic component in the display unit may not be limited by the present disclosure.

Figure 21:
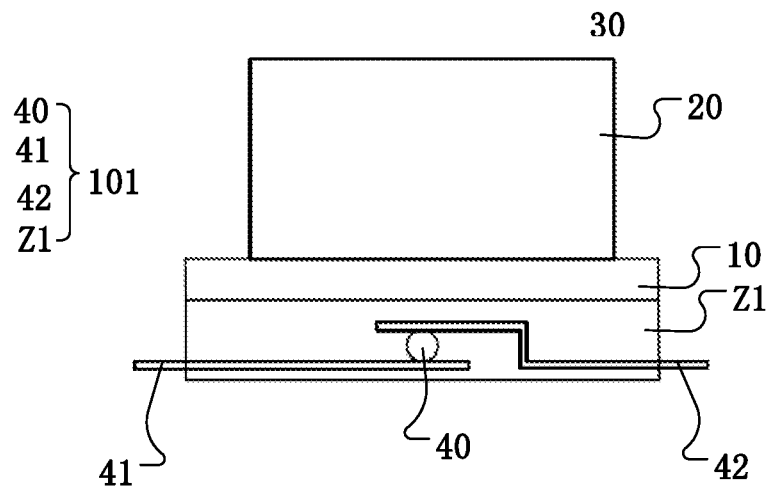
FIG. 21 illustrates a schematic diagram of an exemplary display unit including a position-limit unit consistent with disclosed embodiments of the present disclosure.
Figure 22:
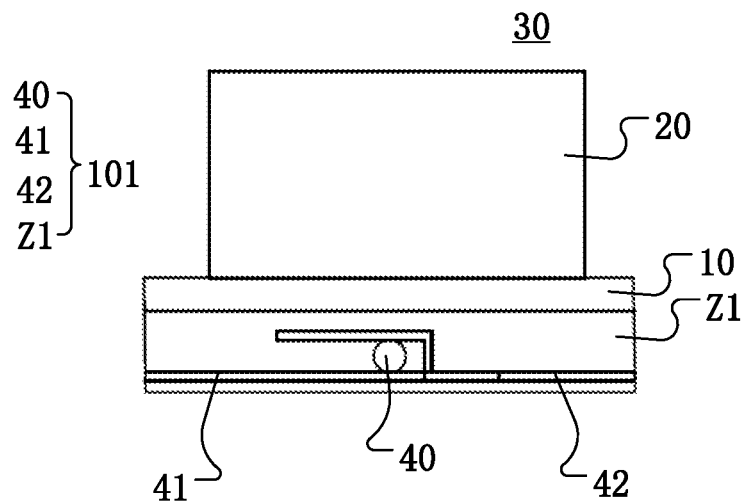
FIG. 22 illustrates a schematic diagram of another exemplary display unit including a position-limit unit consistent with disclosed embodiments of the present disclosure.

In an optional embodiment, FIG. 21 illustrates a schematic diagram of the display unit 30 including a position-limit unit 101 consistent with disclosed embodiments of the present disclosure, which may correspond to a position-limit state of the display unit 30. In another embodiment, FIG. 22 illustrates another schematic diagram of the display unit 30 including the position-limit unit 101 consistent with disclosed embodiments of the present disclosure, which may correspond to a non-position-limit state of the display unit 30. Referring to FIG. 6, the display unit 30 may include the substrate 10 and the display structure 20 disposed on the side of the substrate 10 facing the light-exiting surface. Along the direction perpendicular to the plane of the stretchable substrate 00, the display structure 20 may be located in the substrate 10. In other words, an orthographic projection of the display structure 20 on the plane of the stretchable substrate 00 may be located within an orthographic projection of the substrate 10 on the plane of the stretchable substrate. The display unit 30 may further include the position-limit unit 101, and the position-limit unit 101 may be disposed on the side of the substrate 10 away from the light-exiting surface.

Referring to FIG. 6 and FIGS. 21-22, the display unit 30 may include a position-limit state and a non-position-limit state. In the position-limit state, a width S21 of the position-limit unit 101 of the display unit 30 along the first direction D1 may be greater than the width S0 of the hollow 01 along the first direction D1, and the position-limit unit 101 may be disposed on the side of the stretchable substrate 00 facing the light-exiting surface. In the non-position-limit state, in a same display unit 30, along the direction perpendicular to the plane of the stretchable substrate 00, the position-limit unit 101 may be disposed in the substrate 10. In other words, the orthographic projection of the position-limit unit 101 on the plane of the stretchable substrate 00 may be located within the orthographic projection of the substrate 10 on the plane of the stretchable substrate 00. The position-limit unit 101 may be disposed on a side of the stretchable substrate 00 away from the light-exiting surface. The first direction D1 may be a stretching direction of the stretchable substrate 00.

In the stretched state, both the first display unit 31 and the second display unit 32 may be in the position-limit state. In the first contracted state, the first display unit 31 may be in the position-limit state; and in the second contracted state, the second display unit 32 may be in the position-limit state.

It should be noted that, referring to FIGS. 4-6, the position-limit state of the display unit 30 may be a state where the display unit 30 are fixed on the side of the stretchable substrate 00 facing the light-exiting surface and the display units 30 are prevented from penetrating through the hollow 01 to be located on the side of the stretchable substrate 00 away from the light-exiting surface. The non-position-limit state of the display unit 30 may be a state where the display units 30 are not limited and the display units 30 are capable of penetrating through the hollow 01 to be located on the side of the stretchable substrate 00 away from the light-exiting surface. The width of the position-limit unit 101 of the display unit 30 in the first direction D1 may refer to the width between two edges of the position-limit unit 101 that are oppositely disposed along the first direction D1.

Specifically, the display unit 30 may include the position-limit unit 101, and the display unit 30 may enter the position-limit state or the non-position-limit state by controlling the position-limit unit 101. Referring to FIG. 6, in the position-limit state, the width S21 of the position-limit unit 101 in the first direction D1 may be greater than the width S0 of the hollow 01 in the first direction D1, such that the display unit 30 may be limited to the side of the stretchable substrate 00 facing the light-exiting surface. In the non-position-limit state, the orthographic projection of the position-limit unit 101 on the plane of the stretchable substrate 00 may be located within the orthographic projection of the substrate 10 on the plane of the stretchable substrate 00, such that the display unit 30 may penetrate through the hollow 01 to be located on the side of the stretchable substrate 00 away from the light-exiting surface.

In the stretched state, referring to FIG. 5, because both the first display unit 31 and the second display unit 32 are disposed on the side of the stretchable substrate 00 facing the light-exiting surface, both the first display unit 31 and the second display unit 32 may be controlled to be in a position-limit state, such that the first display unit 31 and the second display unit 32 may be fixed on the side of the stretchable substrate 00 facing the light-exiting surface through the position-limit unit 101.

In the first contracted state, referring to FIG. 6, the first display unit 31 may be disposed on the side of the stretchable substrate 00 facing the light-exiting surface, and the second display unit 32 may be disposed on the side of the stretchable substrate 00 away from the light-exiting surface. The first display unit 31 may be controlled to be in the position-limit state, and the first display unit 31 may be fixed to the side of the stretchable substrate 00 facing the light-exiting surface through the position-limit unit 101 in the first display unit 31. Optionally, when being switched from the stretched state to the first contracted state, the second display unit 32 may be in the non-position-limit state, such that the second display unit 32 may penetrate through the hollow 01 to be located on the side of the stretchable substrate 00 away from the light-exiting surface. After entering the first contracted state, the second display unit 32 may continue to maintain the non-position-limit state or may enter the position-limit state, which may not be limited by the present disclosure.

Similarly, in the second contracted state, referring to FIG. 7, the second display unit 32 may be disposed on the side of the stretchable substrate 00 facing the light-exiting surface, and the first display unit 31 may be disposed on the side of the stretchable substrate 00 away from the light-exiting surface. Therefore, the second display unit 32 may be controlled to be in the position-limit state, and the second display unit 32 may be fixed to the side of the stretchable substrate 00 facing the light-exiting surface through the position-limit unit 101 in the second display unit 32. Optionally, when being switched from the stretched state to the second contracted state, the first display unit 31 may be in the non-position-limit state, such that the first display unit 31 may penetrate through the hollow 01 to be located on the side of the stretchable substrate 00 away from the light-exiting surface. After entering the second contracted state, the first display unit 31 may continue to maintain the non-position-limit state or may enter the position-limit state, which may not be limited by the present disclosure.

In an optional embodiment, referring to FIG. 6, FIG. 21 and FIG. 22, the position-limit unit 101 may include a telescopic rod 41/42, a drive motor 40, and a first body portion Z1. In a same display unit 30, along the direction perpendicular to the plane of the stretchable substrate 00, the first body portion Z1 may be disposed in the substrate 10. In other words, an orthographic projection of the first body portion Z1 on the plane of the stretchable substrate 00 may be within the orthographic projection of the substrate 10 on the plane of the stretchable substrate 00. Along the first direction D1, the drive motor 40 may be connected to the telescopic rod 41/42.

Referring to FIG. 5 and FIG. 6, the stretchable substrate 00 may further include a second body portion 008 disposed at least partially surrounding the hollow 01. In the position-limit state, along the first direction D1, the telescopic rod 41/42 may include a first end, and the drive motor 40 may drive the first end to be extended in a direction away from the first body portion Z1. In a direction perpendicular to the plane of the stretchable substrate 00, at least portion of the telescopic rod 41/42 may overlap the second body portion 008. In other words, the orthographic projection of the telescopic rod 41/42 on the plane of the stretchable substrate 00 may overlap the orthographic projection of the second body portion 008 on the plane of the stretchable substrate 00. In the non-position-limit state, along the direction perpendicular to the plane of the stretchable substrate 00, the telescopic rod 41/42 may be located within the first body portion Z1. In other words, the telescopic rod 41/42 may not exceed the edge of the first body portion Z1.

Specifically, referring to FIGS. 5-7 and FIGS. 21-22, the position-limit unit 101 may include the telescopic rod 41/42, the drive motor 40, and the first body portion Z1. The first body portion Z1 may be regarded as a case disposed on the side of the substrate 10 away from the display structure 20. The drive motor 40 and the telescopic rod 41/42 may be disposed in the case. The drive motor 40 may control the telescopic rod 41/42 to be extended to the outside of the case or to be contracted to inside the case.

In the position-limit state, the first end of the telescopic rod 41/42 may be controlled to be extended along the first direction D1 in a direction away from the first body portion Z1, such that the first end of the telescopic rod 41/42 may be located on a side of the second body portion 008 disposed surrounding the hollow 01 facing the light-exiting surface, and may overlap the second body portion 008. Therefore, the display unit 30 may be fixed on the side of the stretchable substrate 00 facing the light-exiting surface. In the non-position-limit state, the telescopic rod 41/42 may be controlled to be contracted in the direction facing the first body portion Z1.

When being switched from the stretched state to the first contracted state or the second contracted state, along the direction perpendicular to the plane of the stretchable substrate 00, the telescopic rod 41/42 may be located within the first body portion Z1. In other words, the orthographic projection of the telescopic rod 41/42 on the plane of the stretchable substrate 00 may be located within the orthographic projection of the first body portion Z1 on the plane of the stretchable substrate 00. In other words, the telescopic rod 41/42 may not be extended beyond the edge of the first body portion Z1, such that the display unit 30 may penetrate through the hollow 01 to be disposed on the side of the stretchable substrate 00 away from the light-exiting surface. The position-limit state and the non-position-limit state of the display unit 30 may be controlled by the telescopic rod 41/42, such that the display unit 30 may adapt to the structure requirements of the stretchable display panel in the stretched state and the contracted state. Therefore, the position of each display unit 30 of the stretchable display panel in different states may be substantially accurate, and the display may be substantially reliable.

Figure 23:
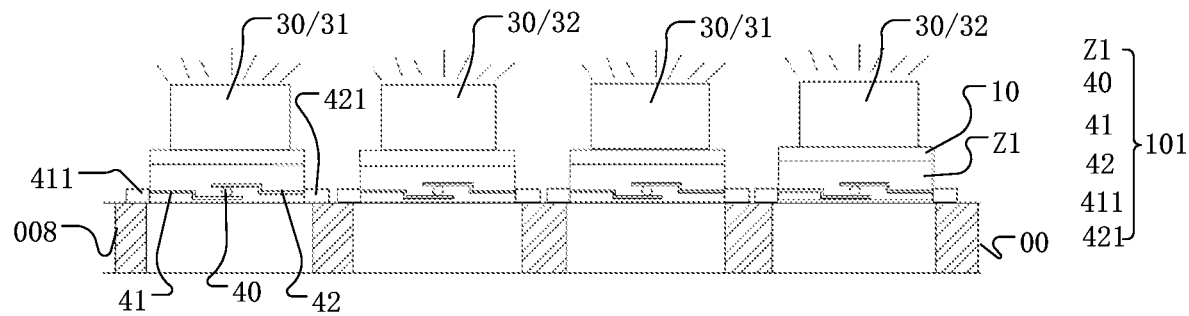
FIG. 23 illustrates a schematic A-A' sectional view of another exemplary stretchable display panel in FIG. 1 consistent with disclosed embodiments of the present disclosure.
Figure 24:
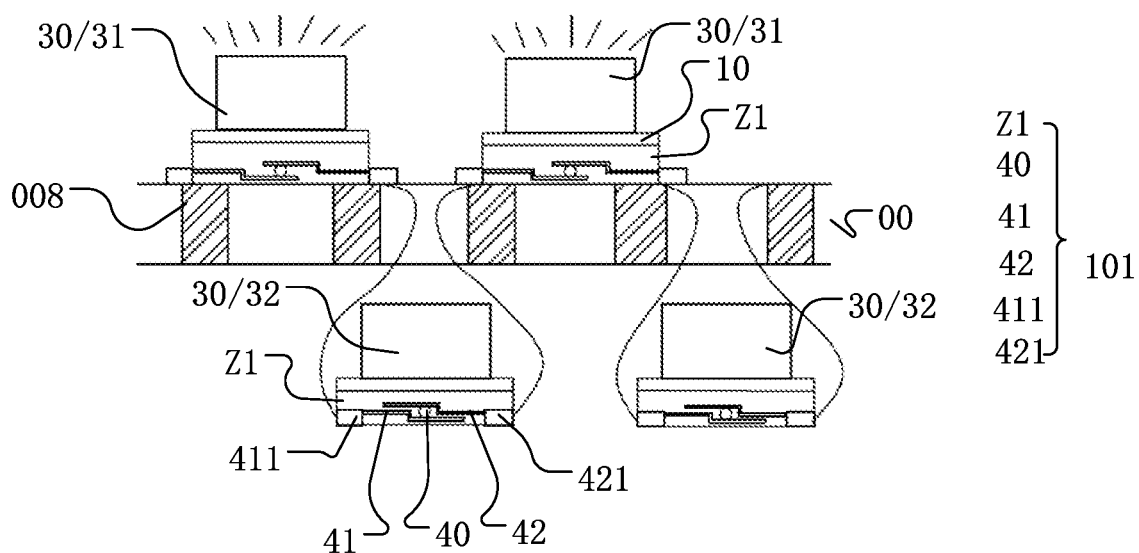
FIG. 24 illustrates a schematic B-B' sectional view of another exemplary stretchable display panel in FIG. 2 consistent with disclosed embodiments of the present disclosure.
Figure 25:
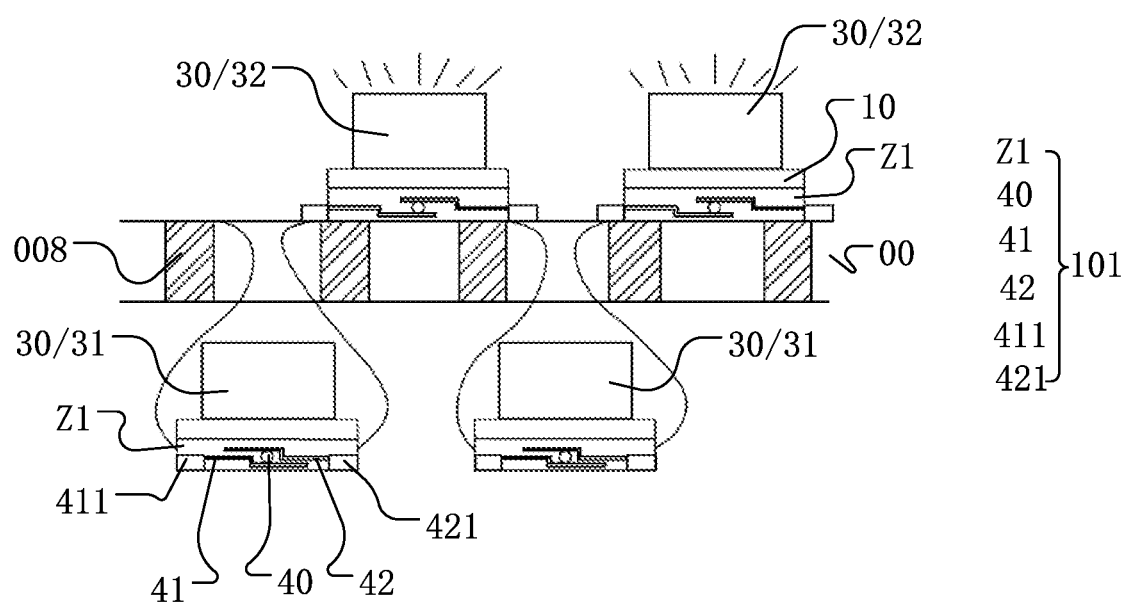
FIG. 25 illustrates a schematic C-C' sectional view of another exemplary stretchable display panel in FIG. 3 consistent with disclosed embodiments of the present disclosure.

FIG. 23 illustrates a schematic A-A' sectional view of the stretchable display panel in FIG. 1; FIG. 24 illustrates a schematic B-B' sectional view of the stretchable display panel in FIG. 2; and FIG. 25 illustrates a schematic C-C' sectional view of the stretchable display panel in FIG. 3. FIG. 23 illustrates the stretched state, FIG. 24 illustrates the first contracted state, and FIG. 25 illustrates the second contracted state. In an optional embodiment, referring to FIG. 23 and FIG. 25, the position-limit unit 101 may further include a first position-limit structure 411 and a second position-limit structure 421. The telescopic rod may include a first telescopic rod 41 and a second telescopic rod 42. The first position-limit structure 411 may be fixed to the first end of the first telescopic rod 41, and the second position-limit structure 421 may be fixed to the first end of the second telescopic rod 42.

In the position-limit state, along the direction perpendicular to the plane of the stretchable substrate 00, the first position-limit structure 411 may at least partially overlap the second body portion 008, and the second position-limit structure 421 may at least partially overlap the second body portion 008. In other words, in the position-limit state, an orthographic projection of the first position-limit structure 411 on the plane of the stretchable substrate 00 may at least partially overlap the orthographic projection of the second body portion 008 on the plane of the stretchable substrate 00, and an orthographic projection of the second position-limit structure 421 on the plane of the stretchable substrate 00 may at least partially overlap the orthographic projection of the second body portion 008 on the plane of the stretchable substrate 00. In the non-position-limit state, along the direction perpendicular to the plane of the stretchable substrate 00, both the first position-limit structure 411 and the second position-limit structure 421 may be located in the first body portion Z1. In other words, both the first position-limit structure 411 and the second position-limit structure 421 may be contracted to be within the range defined by the first body portion Z1, and may not exceed the edge of the first body portion Z1.

Specifically, FIGS. 23-25 illustrate an embodiment in which the first ends of the first position-limit structure 411 and the second position-limit structure 421 may be fixed to the first telescopic rod 41 and the second telescopic rod 42, respectively. In the position-limit state, the first telescopic rod 41 may drive the first position-limit structure 411 to move away from the display structure 20 along the first direction D1, and the second telescopic rod 42 may drive the second position-limit structure 421 to move away from the display structure 20 along the first direction D1. Therefore, in the direction perpendicular to the plane of the stretchable substrate 00, both the first position-limit structure 411 and the second position-limit structure 421 may overlap the second body portion 008, thereby fixing the display unit 30 on the side of the stretchable substrate 00 facing the light-exiting surface.

In the non-position-limit state, the first telescopic rod 41 may drive the first position-limit structure 411 to move toward the direction close to the display structure 20 along the first direction D1, and the second telescopic rod 42 may drive the second position-limit structure 421 to move toward the direction close to the display structure 20 along the first direction D1. Therefore, when being switched from the stretched state to the contracted state, along the direction perpendicular to the plane of the stretchable substrate 00, both the first position-limit structure 411 and the second position-limit structure 421 may be contracted to be within the range defined by the first body portion Z1, such that the corresponding display unit 30 may penetrate through the hollow 01 to be located on the side of the stretchable substrate 00 away from the light-exiting surface. The position-limit state and the non-position-limit state of the display unit 30 may be controlled by the cooperation of the telescopic rod and the position-limit structure, such that the display unit 30 may adapt to the structure requirements of the stretchable display panel in the stretched state and the contracted state. Therefore, the position of each display unit 30 of the stretchable display panel in different states may be substantially accurate, and the display may be substantially reliable.

Figure 26:
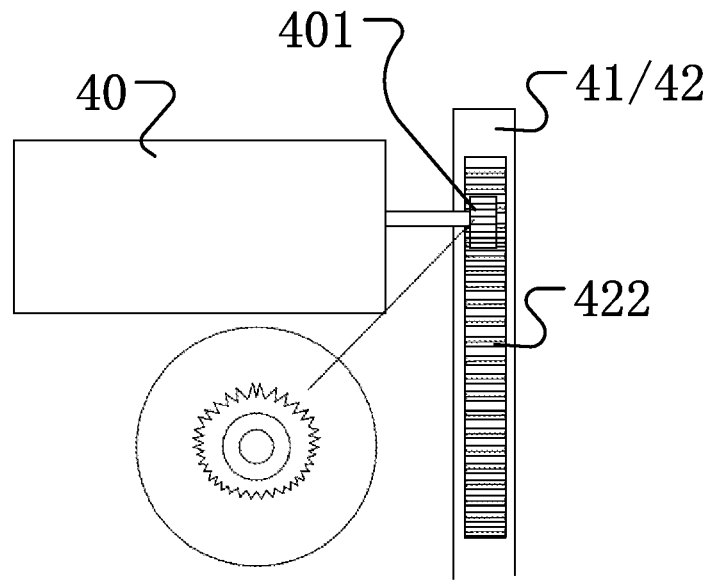
FIG. 26 illustrates a schematic diagram of a relative positional relationship between a drive motor and a telescopic rod in an exemplary position-limit unit consistent with disclosed embodiments of the present disclosure.

FIG. 26 illustrates a schematic diagram of a relative positional relationship between the drive motor and the telescopic rod in the position-limit unit consistent with disclosed embodiments of the present disclosure. In one embodiment, referring to FIG. 26, in the stretchable display panel, the drive motor 40 may include a gear 401, and the telescopic rod 41/42 may include a rack 422. The gear 401 may mesh with the rack 422, and the drive motor 40 may drive the gear 401 to rotate along the rack 422 of the telescopic rod, thereby driving the telescopic rod 41/42 to be extended or contracted. In certain embodiments, the drive motor 40 and the telescopic rod may adopt any other suitable structure, as long as the drive motor 40 is capable of controlling the extension or contraction of the telescopic rod.

It should be noted that when the display unit includes the position-limit unit, for example, referring to FIGS. 23-25, the first body portion Z1 in the position-limit unit 101 may be fixed with respect to the substrate 10. When two adjacent display units 30 are connected to a same elastic lead, the two ends of the elastic lead may be fixed to the substrates of the two adjacent display units, respectively, or may be fixed to the first body portions of the position-limit units in the two adjacent display units, which may not be limited by the present disclosure.

Figure 27:
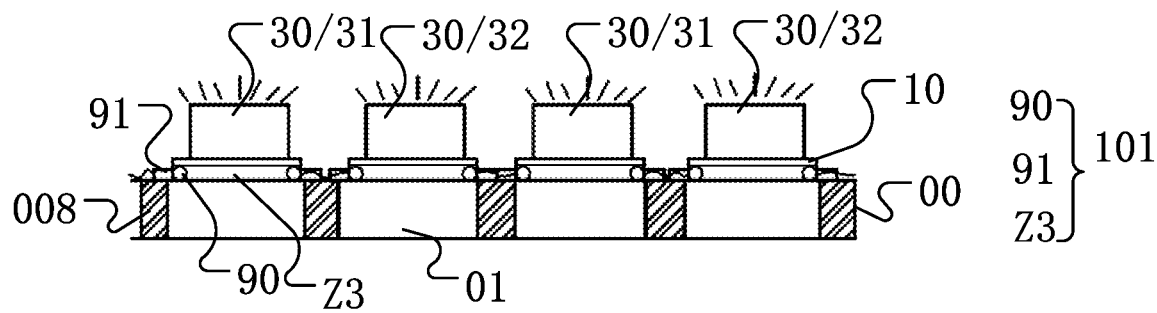
FIG. 27 illustrates a schematic A-A' sectional view of another exemplary stretchable display panel in FIG. 1 consistent with disclosed embodiments of the present disclosure.
Figure 28:
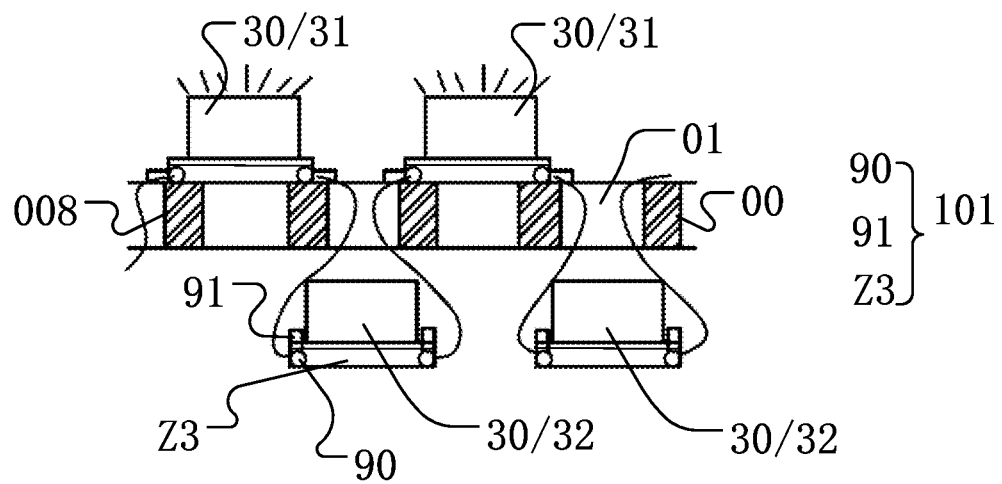
FIG. 28 illustrates a schematic B-B' sectional view of another exemplary stretchable display panel in FIG. 2 consistent with disclosed embodiments of the present disclosure.
Figure 29:
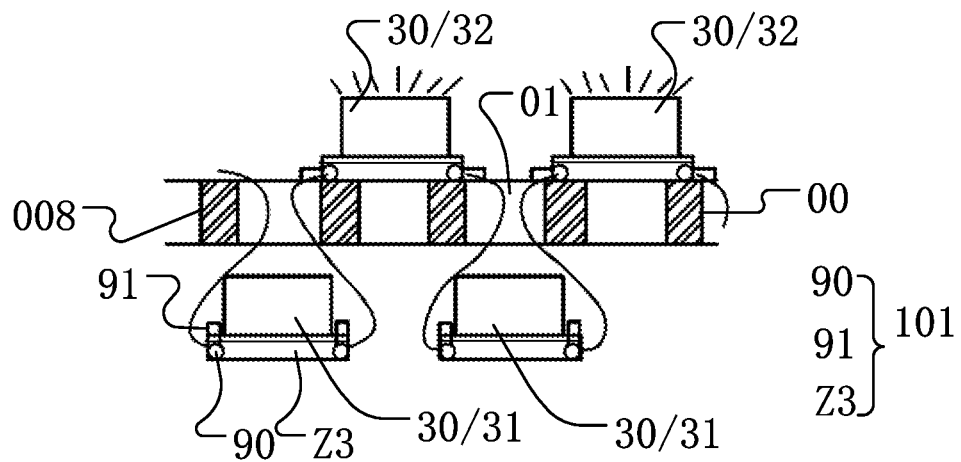
FIG. 29 illustrates a schematic C-C' sectional view of another exemplary stretchable display panel in FIG. 3 consistent with disclosed embodiments of the present disclosure.

FIG. 27 illustrates a schematic A-A' sectional view of the stretchable display panel 100 in FIG. 1; FIG. 28 illustrates a schematic B-B' sectional view of the stretchable display panel in FIG. 2; and FIG. 29 illustrates a schematic C-C' sectional view of the stretchable display panel in FIG. 3. FIG. 27 illustrates the stretched state, FIG. 28 illustrates the first contracted state, and FIG. 29 illustrates the second contracted state.

In an optional embodiment, referring to FIGS. 27-29, the position-limit unit 101 may include a third position-limit structure 91, a rotating motor 90, and a third body portion Z3. The third position-limit structure 91 may be connected to the rotating motor 90. In the same display unit 30, along the direction perpendicular to the plane of the stretchable substrate 00, the third body portion Z3 may be disposed in the substrate 10. In other words, the orthographic projection of the third body portion Z3 on the plane of the stretchable substrate 00 may be located in the orthographic projection of the substrate 10 on the plane of the stretchable substrate 00, and the size of the orthographic projection of the third body portion Z3 may be less than or equal to the size of the orthographic projection of the substrate 10.

In the position-limit state, the rotating motor 90 may drive the third position-limit structure 91 to move, such that the extension direction of the third position-limit structure 91 may be parallel to the plane of the substrate 10. Along the direction perpendicular to the plane of the stretchable substrate 00, the third position-limit structure 91 may at least partially overlap the second body portion 008. In other words, the orthographic projection of the third position-limit structure 91 on the plane of the stretchable substrate 00 may overlap the orthographic projection of the second body portion 008 on the plane of the stretchable substrate 00. In the non-position-limit state, the rotating motor 90 may drive the third position-limit structure 91 to move, such that the extension direction of the third position-limit structure 91 may be perpendicular to the plane of the substrate 10. Along the direction perpendicular to the plane of the stretchable substrate 00, the third position-limit structure 91 may be located in the third body portion Z3. In other words, the orthographic projection of the third position-limit structure 91 on the plane of the stretchable substrate 00 may be located in the orthographic projection of the third body portion Z3 on the plane of the stretchable substrate 00.

Specifically, referring to FIGS. 27-29, the position-limit unit 101 may include the third position-limit structure 91, the rotating motor 90, and the third body portion Z3. The orthographic projection of the third body portion Z3 on the plane of the stretchable substrate 00 may be located within the orthographic projection of the substrate 10 on the plane of the stretchable substrate 00. In other words, the size of the third body portion Z3 may not be greater than the size of the substrate 10. The rotating motor 90 may control the rotation of the third position-limit structure 91. In the position-limit state, the rotating motor 90 may drive the third position-limit structure 91 to rotate to a direction parallel to the plane of the substrate 10, and may make the third position-limit structure 91 overlap the second body portion 008 along a direction perpendicular to the stretchable substrate 00, to ensure that the corresponding display unit 30 is fixed to the side of the stretchable substrate 00 facing the light-exiting surface.

In the non-position-limit state, when the stretchable display panel 100 is switched from the stretched state to the contracted state, the third position-limit structure 91 may be controlled by the rotating motor 90 to rotate toward a direction perpendicular to the plane of the substrate 10, and the third position-limit structure 91 may be located in the third body portion Z3 in a direction perpendicular to the plane of the stretchable substrate 00, to ensure that the corresponding display unit 30 is capable of penetrating through the hollow 01 to be located on the side of the stretchable substrate 00 away from the light-exiting surface. It should be noted that FIGS. 28-29 may merely illustrate a scheme in which the drive motor rotates the third position-limit structure 91 toward the light-exiting surface. In certain embodiments, the third position-limit structure 91 may rotate towards a direction away from the light-exiting surface, as long as the third position-limit structure 91 is located in the hollow 01 in the direction perpendicular to the plane of the stretchable substrate 00 during the transition from the stretched state to the contracted state.

Figure 30:
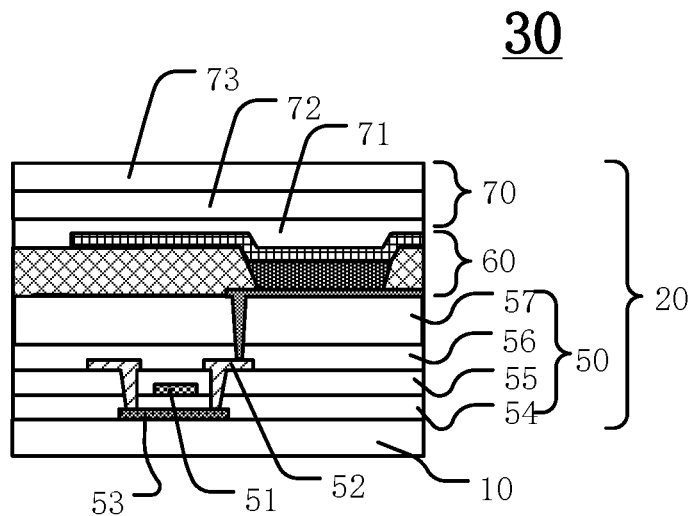
FIG. 30 illustrates a schematic diagram of a sub-pixel in an exemplary display unit consistent with disclosed embodiments of the present disclosure.

In an optional embodiment, FIG. 30 illustrates a schematic diagram of a sub-pixel in the display unit 30 consistent with disclosed embodiments of the present disclosure. Referring to FIG. 30, one display unit 30 may include a plurality of sub-pixels. The present disclosure merely illustrates a film structure of one sub-pixel. The display unit 30 may include a driving circuit layer 50, a light-emitting layer 60, and an encapsulation layer 70. Along a direction perpendicular to the plane of the stretchable substrate 00, the light-emitting layer 60 may be disposed between the driving circuit layer 50 and the encapsulation layer 70, and the encapsulation layer 70 may be disposed on a side of the light-emitting layer 60 facing the light-exiting surface.

Specifically, for illustrative purposes, the display unit 30 may include the driving circuit layer 50, the light-emitting layer 60 and the encapsulation layer 70 that are stacked along the direction perpendicular to the substrate 10 as an example for description. Optionally, the driving circuit layer 50 may include a gate metal layer 51, a semiconductor active layer 53, and a source-drain metal layer 52. The gate metal layer 51 and the semiconductor active layer 53 may be separated by a gate insulating layer 54. The gate insulating layer 54 may be embodied as an inorganic layer including silicon nitride, silicon oxide, or metal oxide, etc. The gate metal layer 51 and the source-drain metal layer 52 may be separated by an interlayer insulating layer 55. The interlayer insulating layer 55 may be embodied as an inorganic layer including silicon nitride, or silicon oxide, etc.

Optionally, a passivation layer 56 may be disposed on the side of the source-drain metal layer 52 away from the interlayer insulating layer 55. The passivation layer 56 may be made of an inorganic layer including silicon oxide, or silicon nitride. The light-emitting layer 60 may include a first electrode, a light-emitting material layer, and a second electrode. Further, the light-emitting layer 60 may include at least one of a hole injection layer (HIL), a hole transport layer (HTL), an electron transport layer (ETL), and an electron injection layer (EIL). If a voltage is applied between the first electrode and the second electrode, the light-emitting material layer may emit visible light, thereby achieving the display function. The encapsulation layer 70 may be disposed on the side of the light-emitting layer 60 away from the driving circuit layer 50, and may protect the light-emitting layer 60 from being affected by the external moisture and oxygen. The encapsulation layer 70 may include a first inorganic layer 71, an organic layer 72, and a second inorganic layer 73.

It should be understood that for illustrative purposes, FIG. 30 may merely illustrate an example of the specific film structure of the display unit 30, which may not be limited by the present disclosure. In certain embodiments, the encapsulation layer 70 may further include an inorganic layer, and the inorganic layer may cover the side of the light-emitting layer away from the substrate, and may encapsulate the light-emitting layer to protect the light-emitting layer from being affected by external moisture and oxygen.

Figure 31:
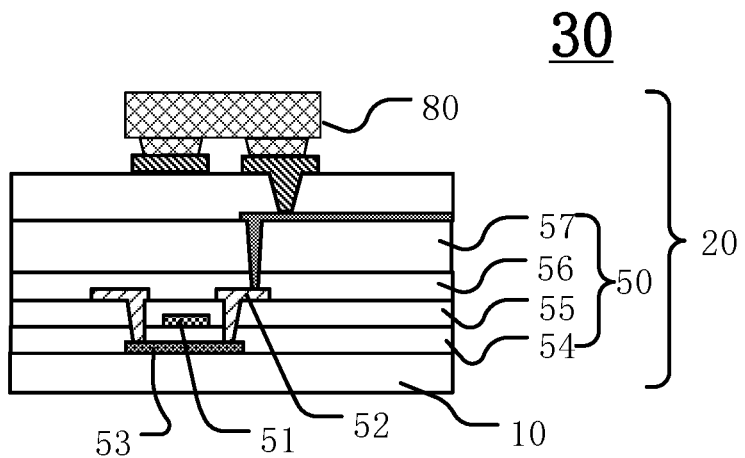
FIG. 31 illustrates a schematic diagram of a sub-pixel in another exemplary display unit consistent with disclosed embodiments of the present disclosure.

In an optional embodiment, FIG. 31 illustrates another schematic diagram of a sub-pixel in the display unit 30 consistent with disclosed embodiments of the present disclosure. Referring to FIG. 31, one display unit 30 may include a plurality of sub-pixels. The present disclosure merely illustrates a film structure of one sub-pixel. The display unit 30 may include a driving circuit layer 50, and a light-emitting element 80 disposed on the side of the driving circuit layer 50 facing the light-exiting surface. The light-emitting element 80 may be at least one of a Micro LED and a Mini LED.

Specifically, for illustrative purposes, the display unit 30 may include the driving circuit layer 50, and the light-emitting element 80 that are stacked over the substrate 10 as an example for description. The light-emitting element 80 may be an inorganic light-emitting diode, such as at least one of Micro LED and Mini LED. Micro LED may be a LED having a grain size in a range of approximately 1 μm-10 μm, which may achieve a display screen with pixel particles of 0.05 mm or smaller. Micro LED may have low power consumption and desired material stability, and may not have image retention. Mini LED, also known as sub-millimeter light-emitting diode, may be a LED having a grain size in a range of approximately 100 μm-1000 μm. Display panels made of Mini LEDs may have a substantially high yield.

Figure 32:
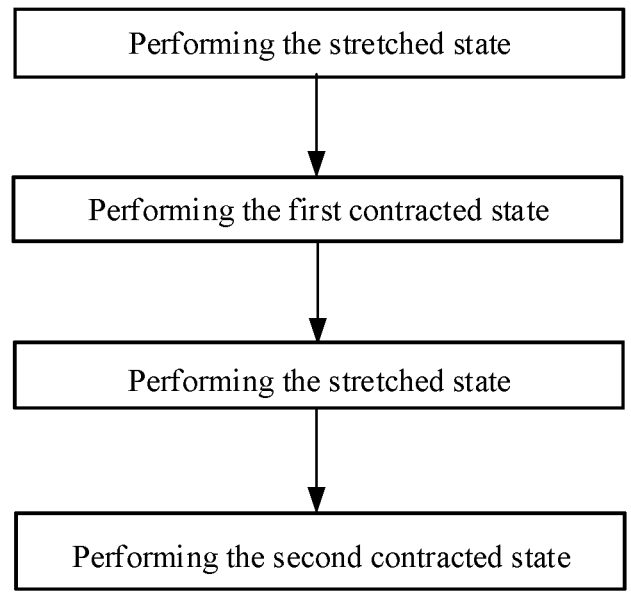
FIG. 32 illustrates a schematic flowchart of an exemplary control method of a stretchable display panel consistent with disclosed embodiments of the present disclosure.

Based on a same concept, the present disclosure also provides a control method of a stretchable display panel. FIG. 32 illustrates a schematic flowchart of a control method of a stretchable display panel consistent with disclosed embodiments of the present disclosure. The disclosed control method of the stretchable display panel may be applied to the stretchable display panel in any one of the disclosed embodiments.

Referring to FIGS. 1-7, the control method may include in a stretched state, controlling both the first display unit 31 and the second display unit 32 to be disposed on a side of the stretchable substrate 00 facing a light-exiting surface of the stretchable display panel 100. The control method may also include in a first contracted state, controlling the first display unit 31 to be disposed on the side of the stretchable substrate 00 facing the light-exiting surface, and controlling the second display unit 32 to be disposed on a side of the stretchable substrate 00 away from the light-exiting surface. Further, the control method may include in a second contracted state, controlling the second display unit 32 to be disposed on the side of the stretchable substrate 00 facing the light-exiting surface, and controlling the first display unit 31 to be disposed on the side of the stretchable substrate 00 away from the light-exiting surface.

Specifically, when the disclosed method is used to control the operation of the stretchable display panel 100, in the first contracted state and the second contracted state, the positions of the first display unit 31 and the second display unit 32 may be different. In the first contracted state, the first display unit 31 may be located on the side of the stretchable substrate 00 facing the light-exiting surface, and the second display unit 32 may be located on the side of the stretchable substrate 00 away from the light-exiting surface. In view of this, the first display unit 31 may perform the display function, and the second display unit 32 may not perform the display function. In the second contracted state, the second display unit 32 may be located on the side of the stretchable substrate 00 facing the light-exiting surface, and the first display unit 31 may be located on the side of the stretchable substrate 00 away from the light-exiting surface. In view of this, the second display unit 32 may perform the display function, and the first display unit 31 may not perform the display function.

Therefore, in different contracted states, the display units 30 that perform the display function may be different, which may effectively prevent merely the fixed display units from performing the display function in the contracted state, may prevent the service life of the fixed display units from being reduced, and may prevent the overall service life of the display panel from being reduced. Therefore, in the disclosed stretchable display panel, the service life of the first display unit 31 and the second display unit 32 may be balanced, and the overall service life of the stretchable display panel may be improved.

In an optional embodiment, referring to FIG. 32, the control method of the stretchable display panel may include performing multiple stretched states, performing multiple first contracted states, and performing multiple second contracted states. The first contracted state may be performed after performing $n^{th}$ stretched state, and the second contracted state may be performed after performing $n+1^{th}$ stretched state, where n may be a positive integer.

Specifically, in the disclosed control method, when the stretchable display panel is controlled to enter the contracted state from the stretched state, the first contracted state and the second contracted state may be alternately performed. For example, the stretchable display panel may be first switched from the stretched state to the first contracted state. After being switched from the first contracted state to the stretched state, and while being switched from the stretched state to the contracted state, the stretchable display panel may be switched to the second contracted state. In other words, the first contracted state and the second contracted state may be performed after each of adjacent two stretched states. Therefore, in different contracted states, the first display unit and the second display unit may alternately perform the display function, which may effectively prevent merely the fixed display units from performing the display function in the contracted state, and may prevent the service life of the fixed display units from being reduced.

Figure 33:
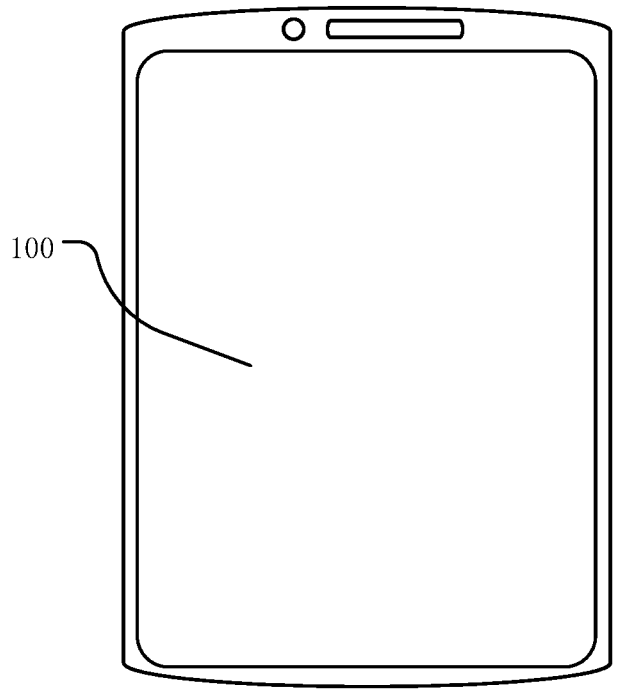
FIG. 33 illustrates a schematic diagram of an exemplary display device consistent with disclosed embodiments of the present disclosure.

Based on a same concept, the present disclosure also provides a display device. FIG. 33 illustrates a schematic diagram of a display device 200 consistent with disclosed embodiments of the present disclosure. Referring to FIG. 33, the display device 200 may include the stretchable display panel 100 in any one of the disclosed embodiments. For illustrative purposes, the display device 200 as a mobile phone in embodiment associated with FIG. 33 may be described in detail as an example. It should be understood that the display device in the present disclosure may be a computer, a TV, a vehicle-mounted display device, a wearable product, or any other display device with a display function, which may not be limited by the present disclosure. The display device 200 in the present disclosure may have the beneficial effects of the stretchable display panel 100 in the present disclosure, which may refer to specific descriptions of the stretchable display panel 100 in the foregoing embodiments, and may not be repeated herein.

Accordingly, the disclosed stretchable display panel, the control method of the stretchable display panel, and the display device may have following beneficial effects. The stretchable display panel may have at least three states, e.g., a stretched state, a first contracted state, and a second contracted state. In the stretched state, both the first display unit and the second display unit may be located on the side of the stretchable substrate facing the light-exiting surface, and both the first display unit and the second display unit may perform the display function. Therefore, both the display area and the quantity of display pixels may increase, which may facilitate to improve the display effect of the display panel in the stretched state.

In particular, in the first contracted state and the second contracted state, the positions of the first display unit and the second display unit may be different. In the first contracted state, the first display unit may be located on the side of the stretchable substrate facing the light-exiting surface, and the second display unit may be located on the side of the stretchable substrate away from the light-exiting surface. In view of this, the first display unit may perform the display function, and the second display unit may not perform the display function. In the second contracted state, the second display unit may be located on the side of the stretchable substrate facing the light-exiting surface, and the first display unit may be located on the side of the stretchable substrate away from the light-exiting surface. In view of this, the second display unit may perform the display function, and the first display unit may not perform the display function.

Therefore, in different contracted states, the display units that perform the display function may be different, which may effectively prevent merely the fixed display units from performing the display function in the contracted state, may prevent the service life of the fixed display units from being reduced, and may prevent the overall service life of the display panel from being reduced. Therefore, in the disclosed stretchable display panel, the service life of the first display unit and the second display unit may be balanced, and the overall service life of the stretchable display panel may be improved.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A stretchable display panel, comprising:
    a stretchable substrate, wherein the stretchable substrate contains a plurality of hollows, and along a thickness direction of the stretchable substrate, a hollow of the plurality of hollows penetrates through the stretchable substrate; and
    a plurality of display units, wherein a display unit of the plurality of display units is disposed corresponding to the hollow, and the plurality of display units include one or more first display units and one or more second display units, wherein:
        the display unit includes a substrate and a display structure disposed on a side of the substrate facing a light-exiting surface, and along a direction perpendicular to a plane of the stretchable substrate, the display structure is located in the substrate;
        the display unit further includes a position-limit unit, and the position-limit unit is disposed on the side of the substrate away from the light-exiting surface;

the stretchable display panel includes a stretched state,
in the stretched state, both the one or more first display units and the one or more second display units are located on a side of the stretchable substrate facing the light-exiting surface of the stretchable display panel,
the display unit includes further a position-limit state, wherein:
in the position-limit state, a width of the position-limit unit along a first direction is greater than a width of the hollow along the first direction, and the position-limit unit is located on the side of the stretchable substrate facing the light-exiting surface, and
in the stretched state, both the one or more first display units and the one or more second display units are in the position-limit state.

2. The stretchable display panel according to claim 1, wherein:
the display unit includes a substrate and a display structure disposed on a side of the substrate facing the light-exiting surface; and
at least one display unit of the plurality of display units includes a first elastic lead and a second elastic lead, wherein:
a first end of the first elastic lead and a first end of the second elastic lead are fixed to two sides of the substrate along a first direction, respectively,
a second end of the first elastic lead and a second end of the second elastic lead are fixed to two sides of the hollow corresponding to the display unit along the first direction, respectively, and are disposed on the side of the stretchable substrate facing the light-exiting surface, and
the first direction is a stretching direction of the stretchable substrate.

3. The stretchable display panel according to claim 2, wherein:
in a same display unit of the plurality of display units, the first elastic lead and the second elastic lead have a same length.

4. The stretchable display panel according to claim 2, wherein:
in a same display unit of the plurality of display units, the first elastic lead and the second elastic lead have a same elastic modulus.

5. The stretchable display panel according to claim 1, wherein:
the display unit includes a substrate and a display structure disposed on a side of the substrate facing the light-exiting surface, and
in the stretched state, along a first direction, a width of the hollow is greater than a width of the substrate in the corresponding display unit.

6. The stretchable display panel according to claim 1, wherein:
in the stretched state, at least part of the one or more first display units and the one or more second display units are alternately arranged.

7. The stretchable display panel according to claim 1, wherein:
the stretchable display panel further includes a stretchable magnetic substrate, and the display unit further includes a magnetic component, wherein the stretchable magnetic substrate is disposed on a side of the display unit away from the light-exiting surface;

the stretchable magnetic substrate includes a plurality of first regions and a plurality of second regions, wherein an orthographic projection of the magnetic component of a first display unit of the one or more first display units on a plane of the stretchable magnetic substrate is located in a first region of the plurality of first regions, and an orthographic projection of the magnetic component of a second display unit of the one or more second display units on the plane of the stretchable magnetic substrate is located in a second region of the plurality of second regions; and
in the stretched state, a magnetic pole of the first region and a magnetic pole of the magnetic component corresponding to the first region that face each other are the same, and a magnetic pole of the second region and a magnetic pole of the magnetic component corresponding to the second region that face each other are the same.

8. The stretchable display panel according to claim 7, wherein:
in the stretched state, magnetic poles of the magnetic components of at least part of adjacent two display units that face the stretchable magnetic substrate are opposite to each other.

9. The stretchable display panel according to claim 7, wherein:
the stretchable magnetic substrate and the stretchable substrate have a same stretch coefficient,
along a first direction, the stretchable substrate includes a first edge and a second edge that are oppositely disposed, and the stretchable magnetic substrate includes a third edge and a fourth edge that are oppositely disposed, wherein the first edge and the third edge are disposed on a same side of the stretchable display panel, and the second edge and the fourth edge are disposed on another same side of the stretchable display panel, and
the stretchable display panel further includes a first fixing portion and a second fixing portion that are oppositely disposed along a first direction, both the first edge and the third edge are fixed to the first fixing portion, and both the second edge and the fourth edge are fixed to the second fixing portion, wherein the first direction is a stretching direction of the stretchable substrate.

10. The stretchable display panel according to claim 7, wherein:
the display unit includes a substrate and a display structure disposed on a side of the substrate facing the light-exiting surface; and
the magnetic component is disposed on a side of the substrate away from the display structure, or
the magnetic component is integrated into the substrate, or
the magnetic component is disposed between the substrate and the display structure.

11. The stretchable display panel according to claim 1, wherein:
the position-limit unit includes a telescopic rod, a drive motor, and a first body portion, wherein in the same display unit, along the direction perpendicular to the plane of the stretchable substrate, the first body portion is located in the substrate, and along the first direction, the drive motor is connected to the telescopic rod, and the stretchable substrate further includes a second body portion disposed at least partially surrounding the hollow, and in the position-limit state, along the first direction, the telescopic rod includes a first end, and the drive motor drives the first end to be extended towards a direction away from the first body portion, and in the direction perpendicular to the plane of the stretchable substrate, at least portion of the telescopic rod overlaps the second body portion.

12. The stretchable display panel according to claim 11, wherein:
the position-limit unit further includes a first position-limit structure and a second position-limit structure, the telescopic rod includes a first telescopic rod and a second telescopic rod, the first position-limit structure is fixed to a first end of the first telescopic rod, and the second position-limit structure is fixed to a first end of the second telescopic rod, and
in the position-limit state, along the direction perpendicular to the plane of the stretchable substrate, the first position-limit structure at least partially overlaps the second body portion, and the second position-limit structure at least partially overlaps the second body portion.

13. The stretchable display panel according to claim 1, wherein:
the position-limit unit includes a third position-limit structure, a rotating motor, and a third body portion, wherein the third position-limit structure is connected to the rotating motor, and in the same display unit, along the direction perpendicular to the plane of the stretchable substrate, the third body portion is located in the substrate; and
in the position-limit state, the rotating motor drives the third position-limit structure to move, such that an extension direction of the third position-limit structure is parallel to a plane of the substrate, and along the direction perpendicular to the plane of the stretchable substrate, the third position-limit structure at least partially overlaps the second body portion.

14. The stretchable display panel according to claim 1, wherein:
the display unit includes a driving circuit layer, a light-emitting layer, and an encapsulation layer, wherein along a direction perpendicular to a plane of the stretchable substrate, the light-emitting layer is disposed between the driving circuit layer and the encapsulation layer, and the encapsulation layer is disposed on a side of the light-emitting layer facing the light-exiting surface.

15. The stretchable display panel according to claim 1, wherein:
the display unit includes a driving circuit layer and a light-emitting element disposed on a side of the driving circuit layer facing the light-exiting surface, wherein the light-emitting element includes at least one of a Micro LED and a Mini LED.

16. A control method of a stretchable display panel, comprising:
providing a stretchable display panel, the stretchable display panel including:
a stretchable substrate, wherein the stretchable substrate contains a plurality of hollows, and along a thickness direction of the stretchable substrate, a hollow of the plurality of hollows penetrates through the stretchable substrate, and
a plurality of display units, wherein a display unit of the plurality of display units is disposed corresponding to the hollow, and the plurality of display units include one or more first display units and one or more second display units;
in a stretched state, controlling both the one or more first display units and the one or more second display units to be disposed on a side of the stretchable substrate facing a light-exiting surface of the stretchable display panel;
in a first contracted state, controlling the one or more first display units to be disposed on the side of the stretchable substrate facing the light-exiting surface, and controlling the one or more second display units to be disposed on a side of the stretchable substrate away from the light-exiting surface; and
in a second contracted state, controlling the one or more second display units to be disposed on the side of the stretchable substrate facing the light-exiting surface, and controlling the one or more first display units to be disposed on the side of the stretchable substrate away from the light-exiting surface.

17. The control method according to claim 16, further including:
performing multiple stretched states, performing multiple first contracted states, and performing multiple second contracted states, wherein the first contracted state is performed after performing $n^{th}$ stretched state, and the second contracted state is performed after performing $n+1^{th}$ stretched state, wherein n is a positive integer.

18. A display device, comprising:
a stretchable display panel, the stretchable display panel including:
a stretchable substrate, wherein the stretchable substrate contains a plurality of hollows, and along a thickness direction of the stretchable substrate, a hollow of the plurality of hollows penetrates through the stretchable substrate; and
a plurality of display units, wherein a display unit of the plurality of display units is disposed corresponding to the hollow, and the plurality of display units include one or more first display units and one or more second display units, wherein:
the stretchable display panel includes a first contracted state, and
in the first contracted state, the one or more first display units are located on the side of the stretchable substrate facing the light-exiting surface, the one or more second display units are located on a side of the stretchable substrate away from the light-exiting surface, and the one or more first display units and the one or more second display units are located on two opposite sides of the stretchable substrate.

* * * * *